(12) United States Patent
Kim et al.

(10) Patent No.: US 9,548,336 B2
(45) Date of Patent: Jan. 17, 2017

(54) IMAGE SENSORS AND ELECTRONIC DEVICES INCLUDING THE SAME

(71) Applicant: Samsung Electronics Co., Ltd., Suwon-Si, Gyeonggi-Do (KR)

(72) Inventors: Kyu Sik Kim, Yongin-si (KR); Satoh Ryuichi, Numazu-si (JP); Hong-Seok Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 21 days.

(21) Appl. No.: 14/566,319

(22) Filed: Dec. 10, 2014

(65) Prior Publication Data

US 2015/0311258 A1    Oct. 29, 2015

(30) Foreign Application Priority Data

Apr. 24, 2014  (KR) .......................... 10-2014-0049352
Nov. 27, 2014  (KR) .......................... 10-2014-0167436

(51) Int. Cl.
 *H01L 27/146*  (2006.01)
 *H01L 27/30*  (2006.01)
 *H01L 51/44*  (2006.01)

(52) U.S. Cl.
 CPC ....... *H01L 27/307* (2013.01); *H01L 27/14645* (2013.01); *H01L 27/14603* (2013.01); *H01L 27/14621* (2013.01); *H01L 27/14643* (2013.01); *H01L 27/14647* (2013.01); *H01L 51/442* (2013.01)

(58) Field of Classification Search
 CPC .................... H01L 27/14603; H01L 27/14643; H01L 27/14621; H01L 27/14645; H01L 27/14647

USPC .................................................. 257/291, 292
See application file for complete search history.

(56) References Cited

U.S. PATENT DOCUMENTS

| | | | |
|---|---|---|---|
| 7,990,444 | B2 | 8/2011 | Kudoh |
| 8,013,928 | B2 | 9/2011 | Egawa |
| 8,040,413 | B2 | 10/2011 | Egawa et al. |
| 8,547,472 | B2 | 10/2013 | Egawa |
| 2013/0093932 | A1 | 4/2013 | Choo et al. |
| 2013/0242148 | A1 | 9/2013 | Mlinar et al. |
| 2014/0184810 | A1* | 7/2014 | Sekiguchi ..................... 348/164 |

FOREIGN PATENT DOCUMENTS

| | | |
|---|---|---|
| JP | 2009239493 A | 10/2009 |
| JP | 4846608 B2 | 12/2011 |

(Continued)

*Primary Examiner* — Marc Armand
*Assistant Examiner* — Tifney Skyles
(74) *Attorney, Agent, or Firm* — Harness, Dickey & Pierce, P.L.C.

(57) ABSTRACT

Image sensors, and electronic devices including the same, include a first photo-sensing device sensing light in a full visible to near infrared ray region, a second photo-sensing device sensing light in a blue wavelength region, a third photo-sensing device sensing light in a red wavelength region, and a fourth photo-sensing device sensing light in a green wavelength region. At least one of the first photo-sensing device, the second photo-sensing device, the third photo-sensing device, and the fourth photo-sensing device includes a pair of light-transmitting electrodes facing each other, and a photoactive layer between the light-transmitting electrodes. The photoactive layer includes an organic light-absorbing material.

15 Claims, 10 Drawing Sheets

(56) References Cited

FOREIGN PATENT DOCUMENTS

| | | |
|---|---|---|
| JP | 5106256 B2 | 12/2012 |
| JP | 2013198160 A | 9/2013 |
| KR | 20090092241 A | 8/2009 |
| KR | 20100055739 A | 5/2010 |
| KR | 20130040439 A | 4/2013 |

* cited by examiner

FIG. 1

| B | G | B | G |
|---|---|---|---|
| W | R | W | R |
| B | G | B | G |
| W | R | W | R |

IMAGE SENSORS AND ELECTRONIC DEVICES INCLUDING THE SAME

This application claims priority under 35 U.S.C. §119 to, and the benefit of, Korean Patent Application No. 10-2014-0049352 filed in the Korean Intellectual Property Office on Apr. 24, 2014 and Korean Patent Application No. 10-2014-0167436 filed in the Korean Intellectual Property Office on Nov. 27, 2014, the entire contents of which are incorporated herein by reference.

BACKGROUND

1. Field

Image sensors and/or electronic devices including the same are disclosed.

2. Description of the Related Art

A photoelectric device converts light into an electrical signal using photoelectric effects, it may include a photodiode, a phototransistor, and the like, and it may be applied to an image sensor, a solar cell, and the like.

An image sensor, including a photodiode, requires a small size and high resolution. In order to realize an image sensor having a smaller size and higher resolution, a size of each pixel needs to be smaller. However, sensitivity may be deteriorated because the image sensor has a small absorption area due to small pixels.

SUMMARY

Example embodiments relate to image sensors.

Example embodiments relate to an image sensor that has a smaller size and is capable of decreasing sensitivity deterioration while having high resolution.

Other example embodiments relate to electronic devices including the image sensor.

According to some example, provided is an image sensor including a first photo-sensing device sensing light in a full visible to near infrared ray region, a second photo-sensing device sensing light in a blue wavelength region, a third photo-sensing device sensing light in a red wavelength region, and a fourth photo-sensing device sensing light in a green wavelength region, wherein at least one of the first photo-sensing device, the second photo-sensing device, the third photo-sensing device, and the fourth photo-sensing device includes a pair of light-transmitting electrodes facing each other and a photoactive layer between the pair of light-transmitting electrodes and including an organic light-absorbing material.

The first, second, third and fourth photo-sensing devices may be arranged adjacently and parallel, or perpendicular, to each other collectively in the form of a single group.

The first photo-sensing device may include a first pair of light-transmitting electrodes and a first photoactive layer between the first pair of light-transmitting electrodes and including a first organic light-absorbing material absorbing light in the full visible to near infrared ray region.

The first organic light-absorbing material may include a p-type semiconductor material and an n-type semiconductor material, and at least one of the p-type semiconductor material and the n-type semiconductor material may absorb light in the full visible to near infrared ray region.

The second photo-sensing device may include a second pair of light-transmitting electrodes, and a second photoactive layer between the second pair of light-transmitting electrodes. The second photoactive layer may selectively absorb light in the blue wavelength region. The third photo-sensing device may include a third pair of light-transmitting electrodes, and a third photoactive layer between the pair of light-transmitting electrodes. The third photoactive layer may selectively absorb light in the red wavelength region. The fourth photo-sensing device may include a fourth pair of light-transmitting electrodes, and a fourth photoactive layer between the fourth pair of light-transmitting electrodes. The fourth photoactive layer may selectively absorb light in the green wavelength region.

The image sensor may include a semiconductor substrate integrated with the second photo-sensing device, the third photo-sensing device, and the fourth photo-sensing device, and a color filter layer on the semiconductor substrate and including a blue filter selectively absorbing light in the blue wavelength region, a red filter selectively absorbing light in the red wavelength region, and a green filter selectively absorbing light in the green wavelength region.

The image sensor may include a color filter layer on the first photo-sensing device, wherein the color filter layer may include a blue filter selectively absorbing light in the blue wavelength region; a red filter selectively absorbing light in the red wavelength region; and a green filter selectively absorbing light in the green wavelength region.

The image sensor may include a semiconductor substrate integrated with the first photo-sensing device, and at least one of the second, third and fourth photo-sensing devices may include the pair of light-transmitting electrodes facing each other and the photoactive layer.

The image sensor may include a semiconductor substrate integrated with the second photo-sensing device and the third photo-sensing device, and a color filter layer on the semiconductor substrate and including a blue filter selectively absorbing light in the blue wavelength region and a red filter selectively absorbing light in the red wavelength region. The fourth photo-sensing device may be on the color filter layer, the fourth photo-sensing device may include a first pair of light-transmitting electrodes facing each other and a first photoactive layer between the pair of light-transmitting electrodes. The first photoactive layer selectively absorbs light in the green wavelength region.

The first photoactive layer may include a p-type semiconductor material selectively absorbing light in the green wavelength region and an n-type semiconductor material selectively absorbing light in the green wavelength region.

The first photo-sensing device may include a second pair of light-transmitting electrodes and a second photoactive layer between the second pair of light-transmitting electrodes and absorbing light in the full visible to near infrared ray region.

The first photo-sensing device may be integrated with the semiconductor substrate.

The blue wavelength region may have a maximum absorption wavelength ($\lambda_{max}$) of greater than or equal to about 400 nm and less than about 500 nm; the red wavelength region may have a maximum absorption wavelength ($\lambda_{max}$) of greater than about 580 nm and less than or equal to about 700 nm; and the green wavelength region may have a maximum absorption wavelength ($\lambda_{max}$) ranging from about 500 nm to about 580 nm.

The organic light-absorbing material may include a p-type semiconductor material and an n-type semiconductor material.

According to yet other example embodiments, an electronic device including the image sensor is provided.

BRIEF DESCRIPTION OF THE DRAWINGS

Example embodiments will be more clearly understood from the following detailed description taken in conjunction with the accompanying drawings. FIGS. 1-10 represent non-limiting, example embodiments as described herein.

FIG. 1 is a schematic view showing an arrangement of a plurality of pixels in an image sensor according to example embodiments.

FIG. 2 is a cross-sectional view showing one example of an image sensor shown in FIG. 1.

FIG. 3 is a cross-sectional view showing another example of an image sensor shown in FIG. 1.

FIG. 4 is a cross-sectional view showing still another example of an image sensor shown in FIG. 1.

FIG. 5 is a cross-sectional view showing a further example of an image sensor shown in FIG. 1.

FIG. 6 is a schematic view showing a pixel arrangement in an image sensor according to other example embodiments.

FIG. 7 is a cross-sectional view showing one example of an image sensor shown in FIG. 6.

FIG. 8 is a cross-sectional view showing a pixel arrangement in an image sensor according to further example embodiments.

FIG. 9 is a cross-sectional view showing one example of an image sensor shown in FIG. 8.

FIG. 10 is a block diagram of a digital camera using an image sensor according to example embodiments.

DETAILED DESCRIPTION

Figure 2:
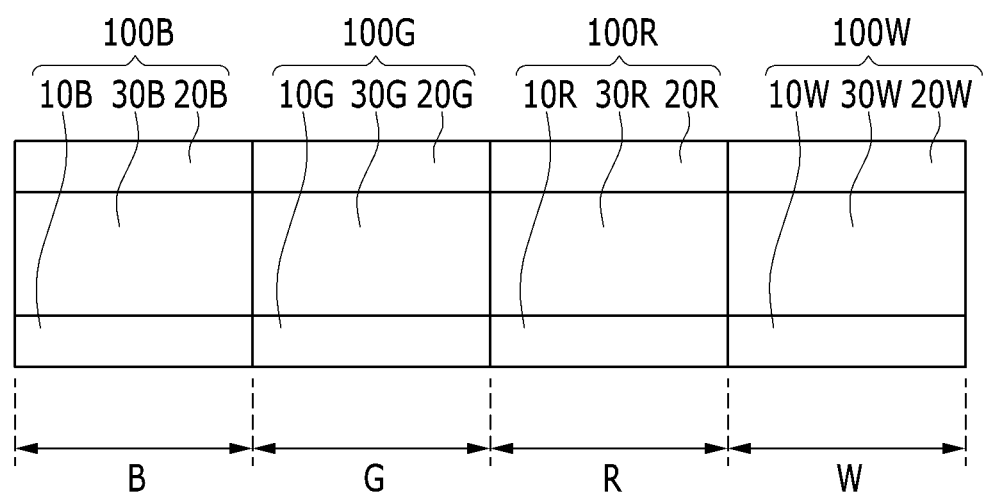

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

As used herein, when a definition is not otherwise provided, the term "white light" refers to a light in the full visible to near infrared ray region having a wavelength of about 380 nm to about 1300 nm, and specifically about 400 nm to 1200 nm.

As used herein, when a definition is not otherwise provided, the term "substituted" refers to one substituted with a substituent with a halogen atom (F, Br, Cl, or I), a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C20 alkyl group, a C1 to C20 alkoxy group, for example a C1 to C4 alkoxy group, a C2 to C20 alkenyl group, a C2 to C20 alkynyl group, a C6 to C30 aryl group, a C7 to C30 arylalkyl group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C20 heterocycloalkyl group, and a combination thereof, instead of hydrogen of a compound.

As used herein, when a definition is not otherwise provided, the term "hetero" refers to one including 1 to 3 heteroatoms selected from, N, O, S, and P.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

An image sensor according to example embodiments is described with reference to the drawings. Herein, a CMOS image sensor as an example of an image sensor is described.

Figure 1:
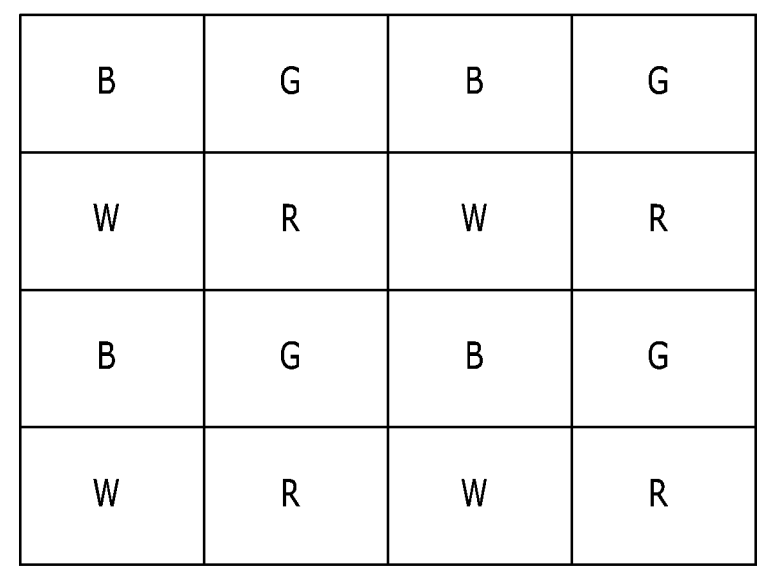

FIG. 1 is a schematic view showing an arrangement of a plurality of pixels in an image sensor according to example embodiments.

As shown in FIG. 1, the image sensor according to example embodiments includes a blue pixel (B), a red pixel (R), a green pixel (G), and a white pixel (W). The blue pixel (B), the red pixel (R), the green pixel (G), and the white pixel (W) are arranged adjacent to each other to provide one group and are repeatedly disposed. However, a cyan pixel, a magenta pixel and a yellow pixel may also be used if necessary.

The blue pixel (B), the red pixel (R), and the green pixel (G) may be pixels selectively sensing light in a blue wavelength region, a red wavelength region, and a green wavelength region, among the full visible to near infrared ray region, respectively; and the white pixel (W) may be a pixel absorbing light in the full visible to near infrared ray region from about 380 nm to about 1300 nm, for example about 400 nm to 1200 nm.

Herein, the blue wavelength region may have a maximum absorption wavelength ($\lambda_{max}$) of greater than or equal to about 400 nm and less than about 500 nm; the red wavelength region may have a maximum absorption wavelength ($\lambda_{max}$) of greater than about 580 nm and less than or equal to about 700 nm; and the green wavelength region may have a maximum absorption wavelength ($\lambda_{max}$) ranging from about 500 nm to about 580 nm.

The blue pixel (B), the red pixel (R), and the green pixel (G) are primary pixels to sense full colors, and by further including the white pixel (W), the light absorptivity of incident light is increased to decrease light loss, and simultaneously the spectral sensitivity of the full visible to near infrared ray region is increased to improve the total sensitivity of the image sensor.

Four pixels including the blue pixel (B), the red pixel (R), the green pixel (G), and the white pixel (W) may be grouped into one group and repeated along a row and/or a column. However, the pixel arrangement may be variously changed.

Each of the blue pixel (B), the red pixel (R), the green pixel (G), and the white pixel (W) includes a photo-sensing device. In other words, the blue pixel (B) may include a blue photo-sensing device sensing light in a blue wavelength region, the red pixel (R) may include a red photo-sensing device sensing light in a red wavelength region, the green pixel (G) may include a green photo-sensing device sensing light in a green wavelength region, and the white pixel (W) may include a white photo-sensing device sensing light in a full visible to near infrared ray region. The photo-sensing device may be, for example, a photodiode.

The blue photo-sensing device, the green photo-sensing device, the red photo-sensing device, and the white photo-sensing device may be arranged adjacently parallel or perpendicular to provide one group.

The blue photo-sensing device, the green photo-sensing device, the red photo-sensing device, and the white photo-sensing device may each be an inorganic photodiode or an organic photodiode, and at least one of the blue photo-sensing device, the green photo-sensing device, the red photo-sensing device, and the white photo-sensing device may be an organic photodiode.

The inorganic photodiode may be, for example, a silicon photodiode, but is not limited thereto.

The organic photodiode may be an organic photoelectric device including a pair of light-transmitting electrodes facing each other, and a photoactive layer disposed between them and including an organic light-absorbing material.

One of the pair of light-transmitting electrode may be an anode and the other may be a cathode. The light-transmitting electrode may be made of, for example, a transparent conductor such as indium tin oxide (ITO), indium zinc oxide (IZO), zinc oxide (ZnO), tin oxide (SnO), aluminum tin oxide (AlTO), and fluorine-doped tin oxide (FTO), or may be a metal thin layer having a thin thickness of several nanometers or several tens of nanometers or a metal thin layer having a thin thickness of several nanometers to several tens of nanometers doped with a metal oxide.

The photoactive layer is a layer including a p-type semiconductor material and an n-type semiconductor material to provide a pn junction, which is a layer producing excitons by receiving light from outside and then separating holes and electrons from the produced excitons.

The photoactive layer may include an intrinsic layer including both the p-type semiconductor and the n-type semiconductor and may be formed according to a method of, for example, co-deposition and the like. In addition, the photoactive layer may further include at least one selected from a p-type layer and an n-type layer besides the intrinsic layer, wherein the p-type layer may include a p-type semiconductor material and the n-type layer may include an n-type semiconductor material. The kind of the p-type semiconductor material and the n-type semiconductor material may be determined according to the absorption wavelength.

At least one of charge auxiliary layers may be further included between the light-transmitting electrode and the photoactive layer. The charge auxiliary layer may further facilitate the movement of holes and electrons separated from the photoactive layer to enhance efficiency, and may be at least one selected from, for example, a hole injection layer (HIL) facilitating hole injection, a hole transport layer (HTL) facilitating hole transportation, an electron blocking layer (EBL) blocking electron transportation, an electron injection layer (EIL) facilitating electron injection, an electron transport layer (ETL) facilitating electron transportation, and a hole blocking layer (HBL) blocking hole transportation.

The hole transport layer (HTL) may include, for example one selected from poly(3,4-ethylenedioxythiophene):poly (styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1- naphthyl)-N-phenyl-amino]biphenyl (α-NPD), m-MTDATA, 4,4',4"-tris(N-carbazolyl)-triphenylamine (TCTA), tungsten oxide (WOx, 0<x≤3), molybdenum oxide (MO$_x$, 1<x≤3), vanadium oxide (V$_2$O$_5$), rhenium oxide, nickel oxide (NiO$_x$, 1<x≤4), copper oxide, titanium oxide, molybdenum sulfide, and a combination thereof, but is not limited thereto.

The electron blocking layer (EBL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), and a combination thereof, but is not limited thereto.

The electron transport layer (ETL) may include one selected from, for example, 1,4,5,8-naphthalene-tetracarboxylic dianhydride (NTCDA), bathocuproine (BCP), LiF, Alq3, Gaq3, Inq3, Znq2, Zn(BTZ)2, BeBq2, aluminum (Al), magnesium (Mg), molybdenum (Mo), aluminum oxide, magnesium oxide, molybdenum oxide, and a combination thereof, but is not limited thereto.

The hole blocking layer (HBL) may include one selected from, for example 1,4,5,8-naphthalene-tetracarboxylic dianhydride (NTCDA), dicyanovinyl-terthiophene (DCV3T), bathocuproine (BCP), LiF, Alq3, Gaq3, Inq3, Znq2, Zn(BTZ)2, BeBq2, and a combination thereof, but is not limited thereto.

The organic photoelectric device may produce excitons at the inside thereof when light in a select (or predetermined) region is absorbed in the photoactive layer by entering light from one light-transmitting electrode side. The excitons are separated into holes and electrons in the photoactive layer, and the separated holes may be transported into an anode side and the separated electrons may be transported into a cathode side to flow current through the organic photoelectric device.

The organic photoelectric device may be applied to various fields, for example, an image sensor, a solar cell, a photo-detector, a photo-sensor, and an organic light emitting diode (OLED), but is not limited thereto.

FIG. 2 is a cross-sectional view showing one example of image sensor shown in FIG. 1.

FIG. 2 illustrates one example of the adjacent blue pixel (B), green pixel (G), red pixel (R), and white pixel (W), but is not limited thereto. Hereinafter, the constituent elements having reference numbers including "B" are constituent elements included in the blue pixel, the constituent elements having reference numbers including "G" are constituent elements included in the green pixel, the constituent elements having reference numbers including "R" are constituent elements included in the red pixel, and the constituent elements having reference numbers including "W" are constituent elements included in the white pixel.

Referring to FIG. 2, an image sensor according to example embodiments includes a blue photo-sensing device 100B, a green photo-sensing device 100G, a red photo-sensing device 100R, and a white photo-sensing device 100W, and the blue photo-sensing device 100B, the green photo-sensing device 100G, the red photo-sensing device 100R, and the white photo-sensing device 100W are independently an organic photodiode.

Specifically, the blue photo-sensing device 100B includes a lower electrode 10B, an upper electrode 20B, and a photoactive layer 30B selectively absorbing light in a blue wavelength region; the green photo-sensing device 100G includes a lower electrode 10G, an upper electrode 20G, and a photoactive layer 30G selectively absorbing light in a green wavelength region; the red photo-sensing device 100R includes a lower electrode 10R, an upper electrode 20R, and a photoactive layer 30R selectively absorbing light in a red wavelength region; and the white photo-sensing device 100W includes a lower electrode 10W, an upper electrode 20W, and a photoactive layer 30W selectively absorbing light in a full visible to near infrared region.

The lower electrodes 10B, 10G, 10R, and 10W and the upper electrodes 20B, 20G, 20R, and 20W may each be a light-transmitting electrode, and may be made of, for example, a transparent conductor such as indium tin oxide (ITO), indium zinc oxide (IZO), zinc oxide (ZnO), tin oxide (SnO), aluminum tin oxide (AlTO), and fluorine-doped tin oxide (FTO), or may be a metal thin layer having a thin thickness of several nanometers or several tens of nanometers or a metal thin layer having a thin thickness of several nanometers to several tens of nanometers doped with a metal oxide.

The photoactive layers 30B, 30G, 30R, and 30W may include a p-type semiconductor material and an n-type semiconductor material. The photoactive layer 30B of the blue photo-sensing device 100B may include a p-type semiconductor material selectively absorbing light in a blue wavelength region and an n-type semiconductor material selectively absorbing light in a blue wavelength region; the photoactive layer 30G of the green photo-sensing device 100G may include a p-type semiconductor material selectively absorbing light in a green wavelength region and an n-type semiconductor material selectively absorbing light in a green wavelength region; and the photoactive layer 30R of the red photo-sensing device 100R may include a p-type semiconductor material selectively absorbing light in a red wavelength region and an n-type semiconductor material selectively absorbing light in a red wavelength region.

A focusing lens (not shown) may be further formed on the blue photo-sensing device 100B, the green photo-sensing device 100G, the red photo-sensing device 100R, and the white photo-sensing device 100W. The focusing lens may control a direction of incident light and gather the light in one region. The focusing lens may have a shape of, for example, a cylinder or a hemisphere, but is not limited thereto.

Figure 3:
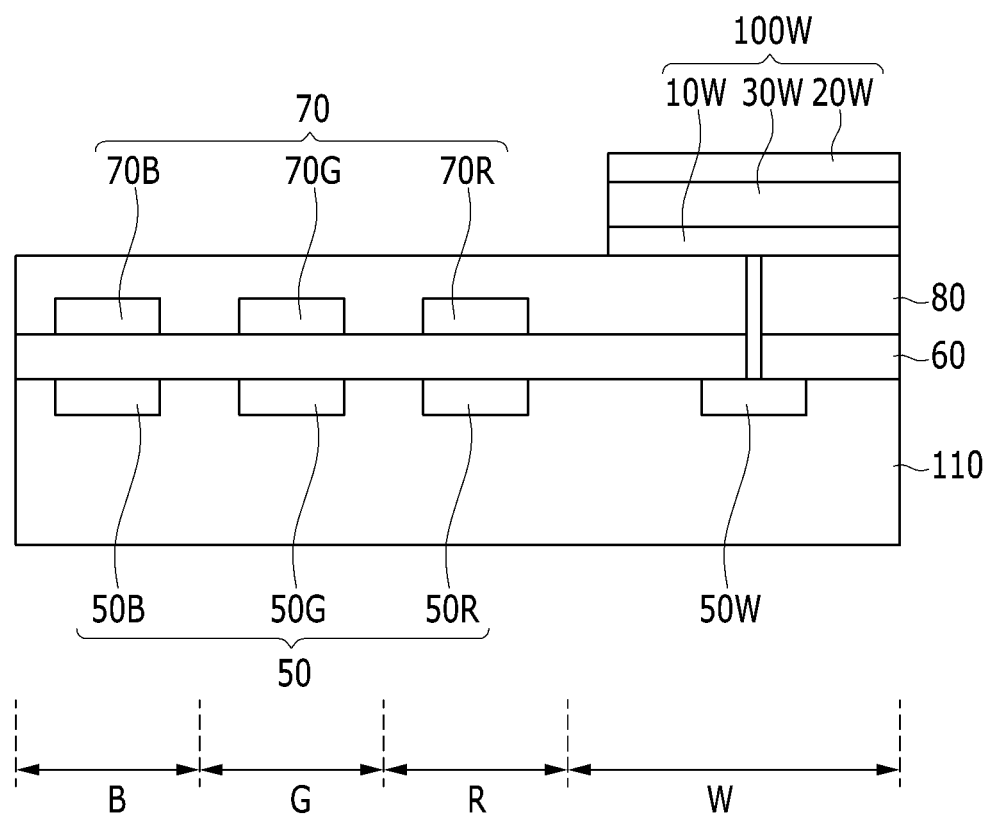

FIG. 3 is a cross-sectional view showing another example of the image sensor shown in FIG. 1.

In the present example embodiment, the white photo-sensing device may be an organic photodiode, and the blue photo-sensing device, the green photo-sensing device, and the red photo-sensing device are independently an inorganic photodiode.

As shown in FIG. 3, the image sensor according to example embodiments includes a semiconductor substrate 110 integrated with a blue photodiode 50B, a green photodiode 50G, a red photodiode 50R, a white charge storage 55W, and a transport transistor (not shown), and a lower insulation layer 60, a color filter layer 70, an upper insulation layer 80, and a white photo-sensing device 100W.

The semiconductor substrate 110 may be a silicon substrate and may be integrated with the blue photodiode 50B, the green photodiode 50G, the red photodiode 50R, and the transport transistor (not shown). The blue photodiode 50B, the green photodiode 50G, and the red photodiode 50R may be respectively integrated with each of a blue pixel, a green pixel, and a red pixel. The blue photodiode 50B, the green photodiode 50G, and the red photodiode 50R may sense light, and the sensed information may be delivered by a transport transistor. The transfer transistor may transfer photocharges generated by the photodiodes to a drive transistor (not shown).

The white charge storage 55W is a place where charges generated from the white photo-sensing device 100W are moved and collected, and is electrically connected to the white photo-sensing device 100W.

Metal wires (not shown) and pads (not shown) are formed on the semiconductor substrate 110. In order to decrease signal delay, the metal wires and pads may be made of a metal having low resistivity, for example, aluminum (Al), copper (Cu), silver (Ag), and alloys thereof, but are not limited thereto.

The lower insulation layer 60 may be formed on the metal wires and pads. The lower insulation layer 60 may be made of an inorganic insulation material such as a silicon oxide and/or a silicon nitride, or a low dielectric constant (low K) material such as SiC, SiCOH, SiCO, and SiOF.

The color filter layer 70 is formed on the lower insulation layer 60. The color filter layer 70 includes a blue filter 70B formed in a blue pixel, a green filter 70G formed in a green pixel, and a red filter 70R formed in a red pixel.

The upper insulation layer 80 is formed on the color filter layer 70. The upper insulation layer 80 removes steps caused by the color filter layer 70, and planarize it. The upper insulation layer 80 and the lower insulation layer 60 may include a contact hole (not shown) exposing a pad and a penetration hole exposing the white charge storage 55W.

The white photo-sensing device 100W is formed on the upper insulation layer 80. The white photo-sensing device 100W is disposed in a white pixel W, and includes light-transmitting electrodes 10W and 20W and a photoactive layer 30W as described above.

One of the light-transmitting electrodes 10W and 20W may be an anode and the other may be a cathode. The light-transmitting electrodes 10W and 20W may be made of, for example, a transparent conductor such as indium tin oxide (ITO), indium zinc oxide (IZO), zinc oxide (ZnO), tin oxide (SnO), aluminum tin oxide (AlTO), and fluorine-doped tin oxide (FTO), or may be a metal thin layer having a thin thickness of several nanometers or several tens of nanometers or a metal thin layer having a thin thickness of several nanometers to several tens of nanometers doped with a metal oxide.

The photoactive layer 30W is disposed between the light-transmitting electrodes 10W and 20W and may absorb light in the full visible to near infrared ray region of about 380 nm to about 1300 nm. The photoactive layer 30W may include a p-type semiconductor material and an n-type semiconductor material, and for example, at least one of the p-type semiconductor material and the n-type semiconductor material may absorb light in the full visible to near infrared ray region.

The photoactive layer 30W may include, for example, at least two selected from polyaniline; polypyrrole; polythiophene; poly(p-phenylenevinylene); benzodithiophene; thienothiophene; MEH-PPV (poly[2-methoxy-5-(2'-ethylhexyloxy)-1,4-phenylene vinylene]); MDMO-PPV (poly(2-methoxy-5-(3,7-dimethyloctyloxy)-1,4-phenylene-vinylene)); pentacene; perylene; poly(3,4-ethylenedioxythiophene) (PEDOT); poly(3-alkylthiophene); poly((4,8-bis(octyloxy)benzo[1,2-b:4,5-b'] dithiophene)-2,6-diyl-alt-(2-((dodecyloxy)carbonyl)thieno [3,4-b]thiophene)-3,6-diyl) (PTB1); poly((4,8-bis(2-ethylhexyloxy)benzo[1,2-b:4,5-b']dithiophene)-2,6-diyl-alt-(2-((2-ethyl hexyloxy)carbonyl)-3-fluorothieno[3,4-b] thiophene)-3,6-diyl) (PTB7); phthalocyanine; tin(II) phthalocyanine (SnPc); copper phthalocyanine; triarylamine; benzidine; pyrazoline; styrylamine; hydrazone; carbazole; thiophene; 3,4-ethylenedioxythiophene (EDOT); pyrrole; phenanthrene; tetracene; naphthalene; rubrene; 1,4,5, 8-naphthalene-tetracarboxylic dianhydride (NTCDA); Alq3; fullerene (C60, C70, C74, C76, C78, C82, C84, C720, C860, and the like); 1-(3-methoxy-carbonyl)propyl-1-phenyl(6,6) C61 (PCBM); a fullerene derivative such as C71-PCBM, C84-PCBM, bis-PCBM, and the like; an inorganic semiconductor such as CdS, CdTe, CdSe, ZnO, and the like; a derivative thereof and a copolymer thereof, but is not limited thereto.

The white photo-sensing device 100W is electrically connected to the white charge storage 55W integrated with the semiconductor substrate 110, and the charges produced from the white photo-sensing device 100W may be collected in the white charge storage 55W.

A focusing lens (not shown) may be further formed on the insulation layer 80 and the white photo-sensing device 100W. The focusing lens may control direction of incident light and gather the light in one region. The focusing lens may have a shape of, for example, a cylinder or a hemisphere, but is not limited thereto.

Figure 4:
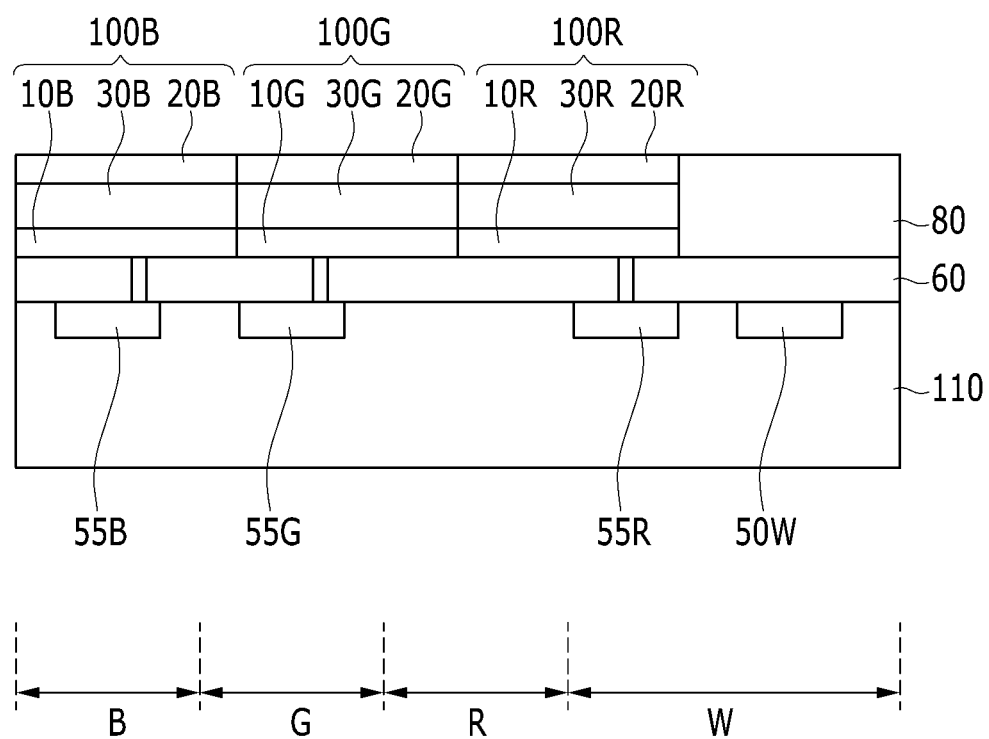

FIG. 4 is a cross-sectional view showing a further example of an image sensor shown in FIG. 1.

In the present example embodiments, the white photo-sensing device is an inorganic photodiode, and the blue photo-sensing device, the green photo-sensing device, and the red photo-sensing device are independently an organic photodiode.

As shown in FIG. 4, the image sensor according to example embodiments includes a semiconductor substrate 110 integrated with a white photodiode 50W, a blue charge storage 55B, a green charge storage 55G, a red charge storage 55R, and a transport transistor (not shown), and a lower insulation layer 60, an upper insulation layer 80, a blue photo-sensing device 100B, a green photo-sensing device 100G, and a red photo-sensing device 100R.

The semiconductor substrate 110 may be a silicon substrate, which is integrated with the white photodiode 50W, the blue charge storage 55B, the green charge storage 55G, the red charge storage 55R, and the transport transistor (not shown). The white photodiode 50W may be integrated with each white pixel, and the blue charge storage 55B, the green charge storage 55G, and the red charge storage 55R may be integrated with the blue pixel, green pixel, and red pixel, respectively. The white photodiode 50W may sense light in the full visible to near infrared ray region, and the sensed information may be delivered by a transport transistor.

The blue charge storage 55B, the green charge storage 55G, and the red charge storage 55R are the places where charges produced in the blue photo-sensing device 100B, the green photo-sensing device 100G, and the red photo-sensing device 100R are transported and collected, and are electrically connected to the blue photo-sensing device 100B, the green photo-sensing device 100G, and the red photo-sensing device 100R, respectively.

Metal wires (not shown) and pads (not shown) are formed on the semiconductor substrate 110. In order to decrease signal delay, the metal wires and pads may be made of a metal having low resistivity, for example, aluminum (Al), copper (Cu), silver (Ag), and alloys thereof, but are not limited thereto.

The lower insulation layer 60 may be formed on the metal wire and pad. The lower insulation layer 60 may be made of an inorganic insulation material such as a silicon oxide and/or a silicon nitride, or a low dielectric constant (low K) material such as SiC, SiCOH, SiCO, and SiOF.

A blue photo-sensing device 100B, a green photo-sensing device 100G, and a red photo-sensing device 100R are formed on the lower insulation layer 60. The blue photo-sensing device 100B includes a lower electrode 10B, an upper electrode 20B, and a photoactive layer 30B selectively absorbing light in the blue wavelength region; the green photo-sensing device 100G includes a lower electrode 10G, an upper electrode 20G, and a photoactive layer 30G selectively absorbing light in the green wavelength region; and the red photo-sensing device 100R includes a lower electrode 10R, an upper electrode 20R, and a photoactive layer 30R selectively absorbing light in the red wavelength region.

The lower electrodes 10B, 10G, and 10R and upper electrodes 20B, 20G, and 20R may be light-transmitting electrodes, and may be made of, for example, a transparent conductor such as indium tin oxide (ITO), indium zinc oxide (IZO), zinc oxide (ZnO), tin oxide (SnO), aluminum tin oxide (AlTO), and fluorine-doped tin oxide (FTO), or may be a metal thin layer having a thin thickness of several nanometers or several tens of nanometers or a metal thin layer having a thin thickness of several nanometers to several tens of nanometers doped with a metal oxide.

The photoactive layers 30B, 30G, and 30R may include a p-type semiconductor material and an n-type semiconductor material. The photoactive layer 30B of the blue photo-sensing device 100B may include a p-type semiconductor material selectively absorbing light in a blue wavelength region and an n-type semiconductor material selectively absorbing light in a blue wavelength region; the photoactive layer 30G of the green photo-sensing device 100G may include a p-type semiconductor material selectively absorbing light in a green wavelength region and an n-type semiconductor material selectively absorbing light in a green wavelength region; and the photoactive layer 30R of the red photo-sensing device 100R may include a p-type semiconductor material selectively absorbing light in a red wavelength region and an n-type semiconductor material selectively absorbing light in a red wavelength region.

An upper insulation layer 80 is formed on the lower insulation layer 60. The upper insulation layer 80 may be disposed in the white pixel, and may reduce steps with the blue photo-sensing device 100B, the green photo-sensing device 100G, and the red photo-sensing device 100R.

A focusing lens (not shown) may be further formed on the blue photo-sensing device 100B, the green photo-sensing device 100G, the red photo-sensing device 100R, and the upper insulation layer 80. The focusing lens may control a direction of incident light and gather the light in one region. The focusing lens may have a shape of, for example, a cylinder or a hemisphere, but is not limited thereto.

Figure 5:
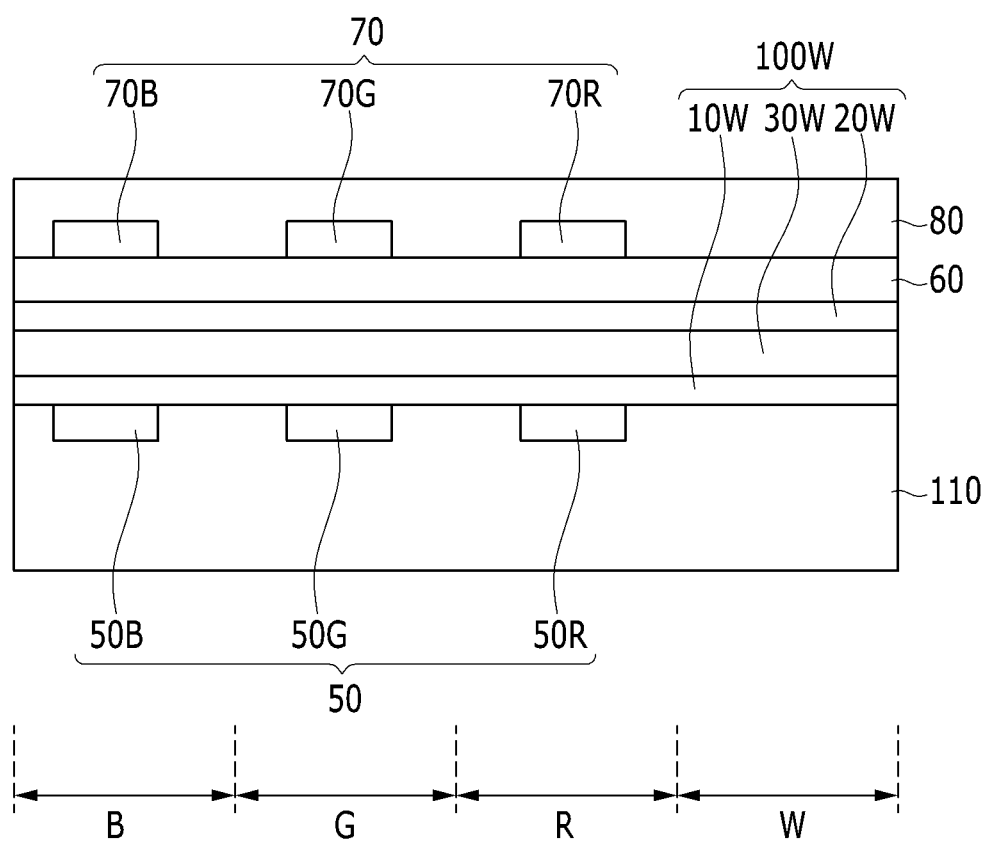

FIG. 5 is a cross-sectional view showing another example of an image sensor shown in FIG. 1.

In the present example embodiments, the white photo-sensing device may be an organic photodiode, and the blue photo-sensing device, the green photo-sensing device, and the red photo-sensing device may independently be an inorganic photodiode.

As shown in FIG. 5, the image sensor according to example embodiments includes a semiconductor substrate 110 integrated with a blue photodiode 50B, a green photodiode 50G, a red photodiode 50R, a white charge storage 55W, and a transport transistor (not shown), and a white photo-sensing device 100W, a lower insulation layer 60, a color filter layer 70, and an upper insulation layer 80.

The semiconductor substrate 110 may be a silicon substrate, which is integrated with the blue photodiode 50B, the green photodiode 50G, the red photodiode 50R, the white charge storage 55W, and the transport transistor (not shown). The blue photodiode 50B, the green photodiode 50G, the red photodiode 50R may be integrated with the blue pixel, the green pixel, and the red pixel, respectively. The blue photodiode 50B, the green photodiode 50G, and the red photodiode 50R may sense light, and the information sensed by the blue photodiode 50B, the green photodiode 50G, and the red photodiode 50R may be delivered through a transport transistor.

The white charge storage 55W is a place where the charges produced from the white photo-sensing device 100W are moved and collected, and it is electrically connected to a white photo-sensing device 100W.

Metal wires (not shown) and pads (not shown) are formed on the semiconductor substrate 110. In order to decrease signal delay, the metal wires and pads may be made of a metal having low resistivity, for example, aluminum (Al), copper (Cu), silver (Ag), and alloys thereof, but are not limited thereto.

The white photo-sensing device 100W may be formed on the metal wire and pad. The white photo-sensing device 100W is formed on the entire surface of the semiconductor substrate 110. The white photo-sensing device 100W includes light-transmitting electrodes 10W and 20W and a photoactive layer 30W.

One of the light-transmitting electrodes 10W and 20W may be an anode and the other may be a cathode. The light-transmitting electrodes 10W and 20W may be made of, for example, a transparent conductor such as indium tin oxide (ITO), indium zinc oxide (IZO), zinc oxide (ZnO), tin oxide (SnO), aluminum tin oxide (AlTO), and fluorine-doped tin oxide (FTO), or may be a metal thin layer having a thin thickness of several nanometers or several tens of nanometers or a metal thin layer having a thin thickness of several nanometers to several tens of nanometers doped with a metal oxide.

The photoactive layer 30W is disposed between the light-transmitting electrodes 10W and 20W, and may absorb light in the full visible to near infrared ray region of about 380 nm to about 1300 nm. The photoactive layer 30W may include a p-type semiconductor material and an n-type semiconductor material. For example, at least one of the p-type semiconductor material and the n-type semiconductor material may absorb light in the full visible to near infrared ray region.

The photoactive layer 30W may include, for example at least two selected from polyaniline; polypyrrole; polythiophene; poly(p-phenylenevinylene); benzodithiophene; thienothiophene; MEH-PPV (poly[2-methoxy-5-(2'-ethylhexyloxy)-1,4-phenylene vinylene]); MDMO-PPV (poly(2-methoxy-5-(3,7-dimethyloctyloxy)-1,4-phenylene-vinylene)); pentacene; perylene; poly(3,4-ethylenedioxythiophene) (PEDOT); poly(3-alkylthiophene); poly((4,8-bis(octyloxy)benzo[1,2-b:4,5-b']dithiophene)-2,6-diyl-alt-(2-((dodecyloxy)carbonyl)thieno[3,4-b]thiophene)-3,6-diyl) (PTB1); poly((4,8-bis(2-ethylhexyloxy)benzo[1,2-b:4,5-b']dithiophene)-2,6-diyl-alt-(2-((2-ethyl hexyloxy)carbonyl)-3-fluorothieno[3,4-b]thiophene)-3,6-diyl) (PTB7); phthalocyanine; tin(II) phthalocyanine (SnPc); copper phthalocyanine; triarylamine; benzidine; pyrazoline; styrylamine; hydrazone; carbazole; thiophene; 3,4-ethylenedioxythiophene (EDOT); pyrrole; phenanthrene; tetracene; naphthalene; rubrene; 1,4,5,8-naphthalene-tetracarboxylic dianhydride (NTCDA); Alq3;

fullerene (C60, C70, C74, C76, C78, C82, C84, C720, C860, and the like); 1-(3-methoxy-carbonyl)propyl-1-phenyl(6,6) C61 (PCBM); a fullerene derivative such as C71-PCBM, C84-PCBM, bis-PCBM, and the like; an inorganic semiconductor such as CdS, CdTe, CdSe, ZnO, and the like; a derivative thereof and a copolymer thereof, but is not limited thereto.

The white photo-sensing device 100W is electrically connected to the white charge storage 55W integrated with the semiconductor substrate 110, and the charges produced from the white photo-sensing device 100W may be collected in the white charge storage 55W.

The lower insulation layer 60 is formed on the white photo-sensing device 100W. The lower insulation layer 60 may be made of an inorganic insulation material such as a silicon oxide and/or a silicon nitride, or a low dielectric constant (low K) material such as SiC, SiCOH, SiCO, and SiOF.

The color filter layer 70 is formed on the lower insulation layer 60. The color filter layer 70 includes a blue filter 70B formed in a blue pixel, a green filter 70G formed in a green pixel, and a red filter 70R formed in a red pixel.

The upper insulation layer 80 is formed on the color filter layer 70. The upper insulation layer 80 removes steps caused by the color filter layer 70, and planarize it.

A focusing lens (not shown) may be further formed on the upper insulation layer 80. The focusing lens may control a direction of incident light and gather the light in one region. The focusing lens may have a shape of, for example, a cylinder or a hemisphere, but is not limited thereto.

Hereinafter, the image sensor according to other example embodiments is described with reference to FIG. 6 and FIG. 7.

Figure 6:
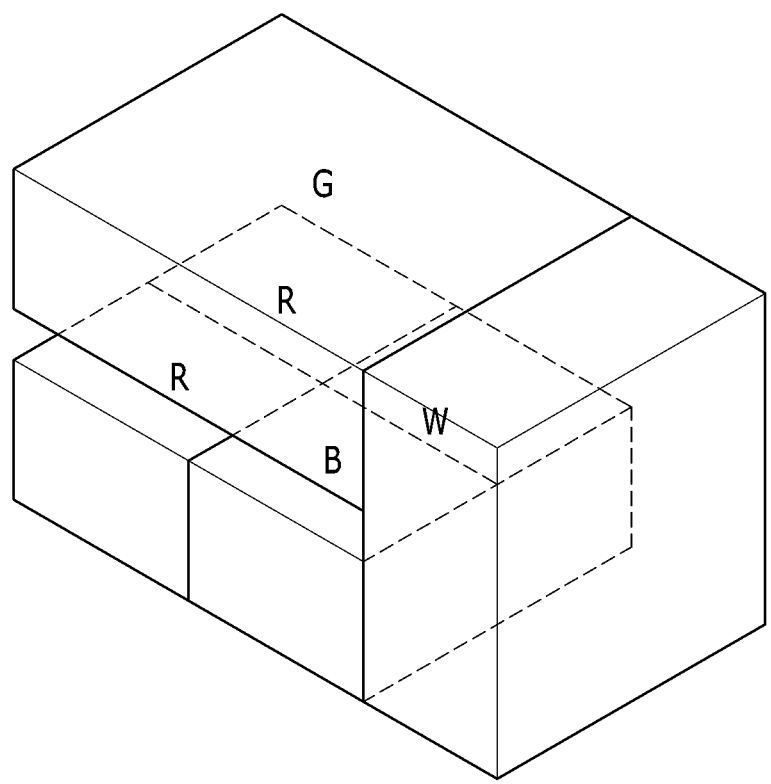
Figure 7:
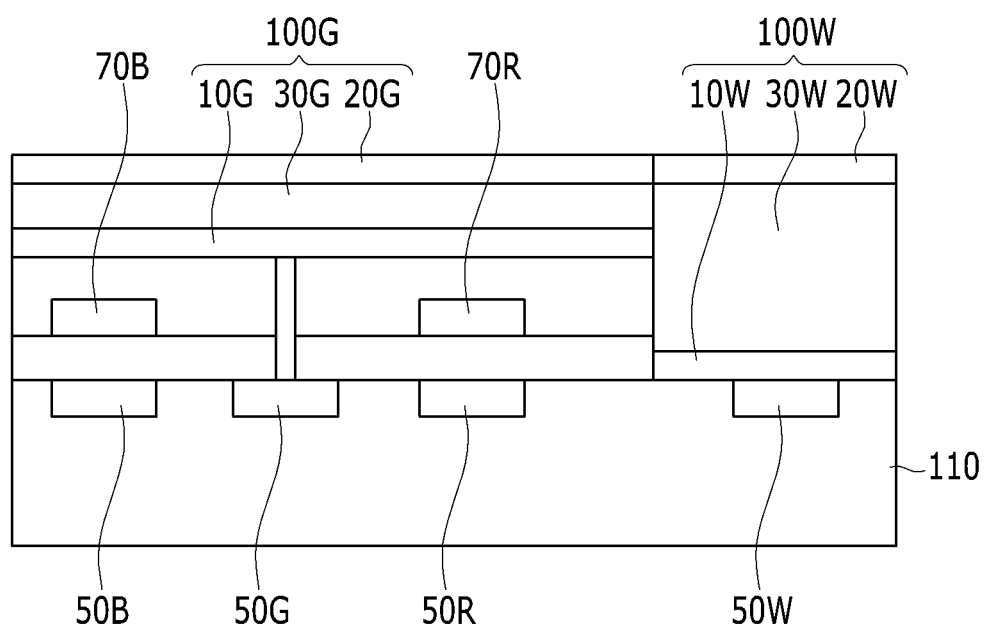

FIG. 6 is a schematic view showing a pixel arrangement in the image sensor according to other example embodiments, and FIG. 7 is a cross-sectional view showing one example of the image sensor shown in FIG. 6.

As shown in FIG. 6, in the image sensor according to example embodiments, a blue pixel B and a red pixel R are arranged adjacent to each other; the green pixel G is stacked above the blue pixel B and the red pixel R; and the white pixel W is arranged adjacent and parallel to the blue pixel B, the red pixel R, and the green pixel G.

According to the present example embodiments, the white photo-sensing device and the green photo-sensing device may independently be an organic photodiode, and the blue photo-sensing device and the red photo-sensing device may independently be an inorganic photodiode.

Referring to FIG. 7, the image sensor according to example embodiments includes a semiconductor substrate 110 integrated with a blue photodiode 50B, a red photodiode 50R, a green charge storage 55G, a white charge storage 55W, and a transport transistor (not shown), and a lower insulation layer 60, color filter layers 70B and 70R, an upper insulation layer 80, a green photo-sensing device 100G, and a white photo-sensing device 100W.

The semiconductor substrate 110 may be a silicon substrate, which is integrated with the blue photodiode 50B, the red photodiode 50R, the green charge storage 55G, the white charge storage 55W, and the transport transistor (not shown). The blue photodiode 50B and the transport transistor may be integrated in each blue pixel; the red photodiode 50R and the transport transistor may be integrated in each red pixel; and the green charge storage 55G and the transport transistor may be integrated in each green pixel.

Metal wires (not shown) and pads (not shown) are formed on the semiconductor substrate 110. In order to decrease signal delay, the metal wires and pads may be made of a metal having low resistivity, for example, aluminum (Al), copper (Cu), silver (Ag), and alloys thereof, but are not limited thereto. However, it is not limited to the structure, and the metal wire and pad may be disposed under the blue photodiode 50B, the red photodiode 50R, the green charge storage 55G, and the white charge storage 55W.

The lower insulation layer 60 may be formed on the metal wire and pad. The lower insulation layer 60 may be made of an inorganic insulation material such as a silicon oxide and/or a silicon nitride, or a low dielectric constant (low K) material such as SiC, SiCOH, SiCO, and SiOF.

The color filters 70B and 70R are formed on the lower insulation layer 60. The color filter 70B of the blue pixel absorbs light in the blue wavelength region and transfers it to the blue photo-sensing device 50B, and the color filter 70R of the red pixel absorbs light in the red wavelength region and transfers it to the red photo-sensing device 50R. The green pixel does not include a color filter.

The upper insulation layer 80 is formed on the color filters 70B and 70R. The upper insulation layer 80 may remove steps caused by the color filter layers 70B and 70R, and planarize it.

A green photo-sensing device 100G is formed on the upper insulation layer 80. The green photo-sensing device 100G includes light-transmitting electrodes 10G and 20G and a photoactive layer 30G.

One of the light-transmitting electrodes 10G and 20G may be an anode and the other may be a cathode. The light-transmitting electrodes 10G and 20G may be made of, for example, a transparent conductor such as indium tin oxide (ITO), indium zinc oxide (IZO), zinc oxide (ZnO), tin oxide (SnO), aluminum tin oxide (AlTO), and fluorine-doped tin oxide (FTO), or may be a metal thin layer having a thin thickness of several nanometers or several tens of nanometers or a metal thin layer having a thin thickness of several nanometers to several tens of nanometers doped with a metal oxide.

The photoactive layer 30G selectively absorbs light in the green wavelength region and passes light in other wavelength regions except the green wavelength region, which are the blue wavelength region and the red wavelength region.

The photoactive layer 30G may include a p-type semiconductor material selectively absorbing light in the green wavelength region, and an n-type semiconductor material selectively absorbing light in the green wavelength region, and the p-type semiconductor material and the n-type semiconductor material may provide a pn junction. The photoactive layer 30G selectively absorbs light in the green wavelength region and produces excitons, and then the produced excitons are separated into holes and electrons to impart the photoelectric effects. The photoactive layer 30G may be substituted for a color filter of the green pixel.

Each of the p-type semiconductor material and the n-type semiconductor material may have an energy bandgap of, for example, about 2.0 to about 2.5 eV, and the p-type semiconductor material and the n-type semiconductor material may have a LUMO difference of, for example, about 0.2 to about 0.7 eV.

The p-type semiconductor material may be, for example, quinacridone or a derivative thereof, and the n-type semiconductor material may be, for example, a cyanovinyl group-containing a thiophene derivative, but they are not limited thereto.

The quinacridone or derivative thereof may be, for example, represented by the following Chemical Formula 1.

Chemical Formula 1

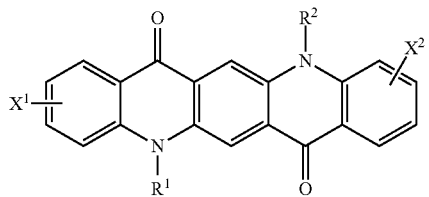

In the above Chemical Formula 1,

R¹ and R² are independently hydrogen, a substituted or unsubstituted C1 to C30 alkyl group, a substituted or unsubstituted C6 to C30 aryl group, a substituted or unsubstituted C3 to C30 heteroaryl group, or a combination thereof, X¹ and X² are independently hydrogen, a substituted or unsubstituted C1 to C30 alkyl group, a substituted or unsubstituted C2 to C30 alkenyl group, a substituted or unsubstituted C6 to C30 aromatic group, a substituted or unsubstituted C3 to C30 heterocyclic aromatic group, a cyano-containing group, a halogen-containing group, or a combination thereof.

The quinacridone or derivatives thereof may be represented by, for example, the following Chemical Formulae 1a to 1o, but are not limited thereto.

Chemical Formula 1a

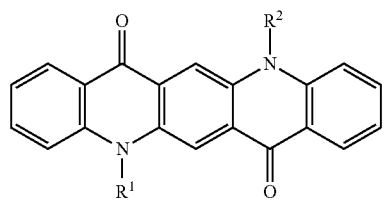

Chemical Formula 1b

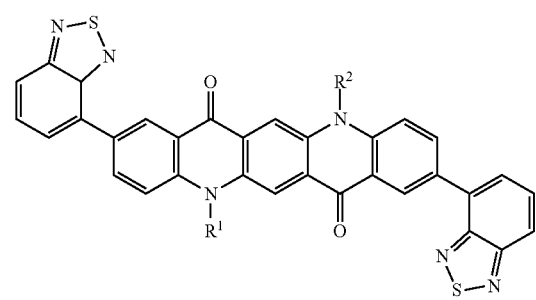

Chemical Formula 1c

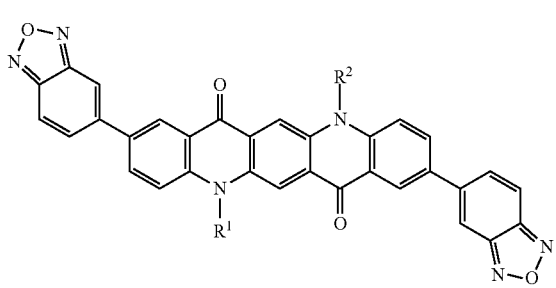

Chemical Formula 1d

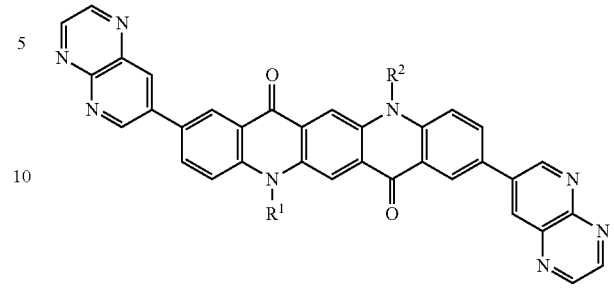

Chemical Formula 1e

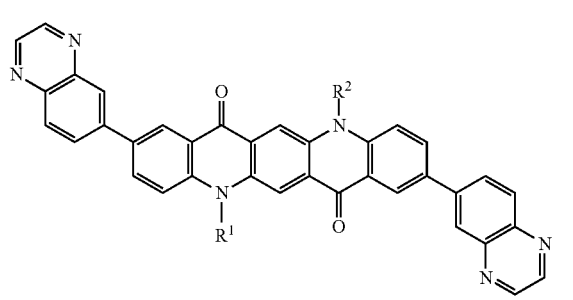

Chemical Formula 1f

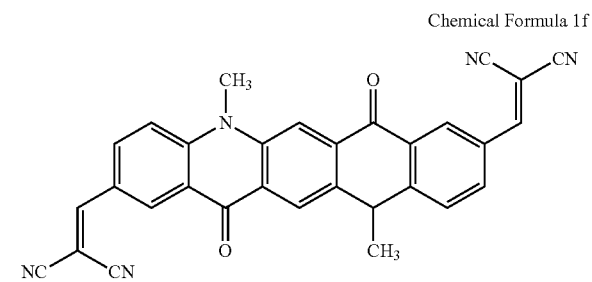

Chemical Formula 1g

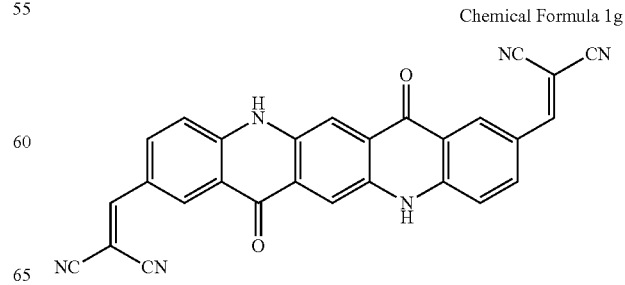

Chemical Formula 1h
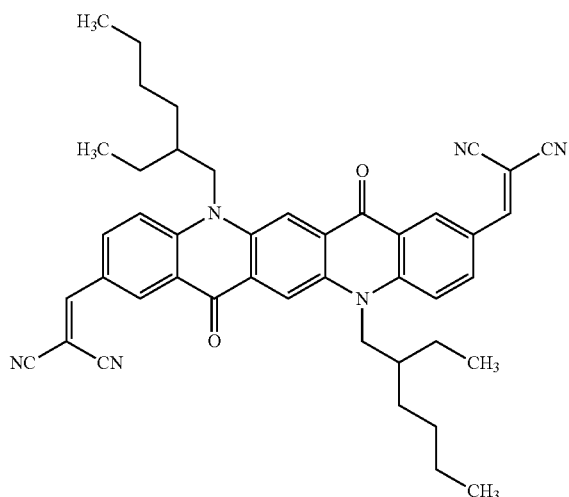

Chemical Formula 1i
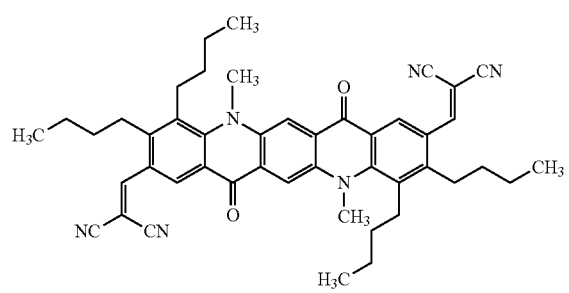

Chemical Formula 1j
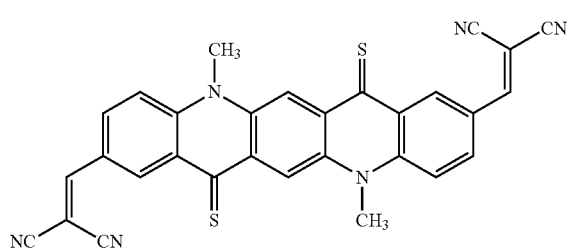

Chemical Formula 1k
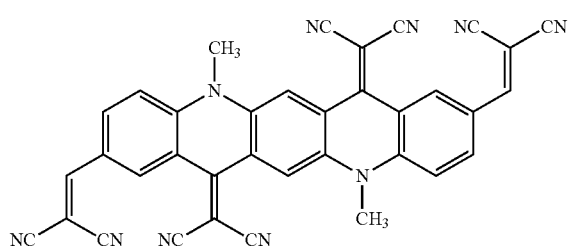

Chemical Formula 1l
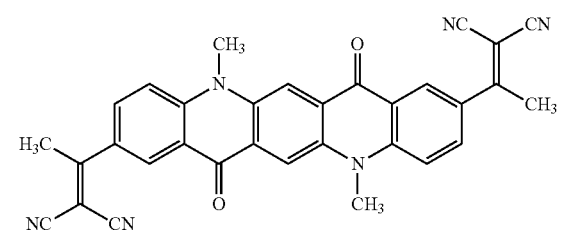

Chemical Formula 1m
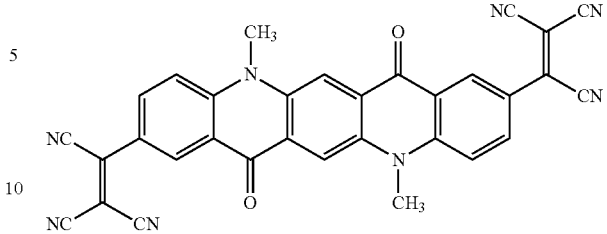

Chemical Formula 1n
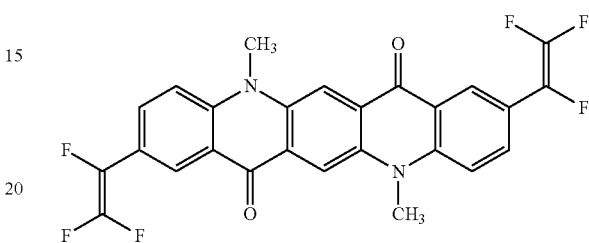

Chemical Formula 1o
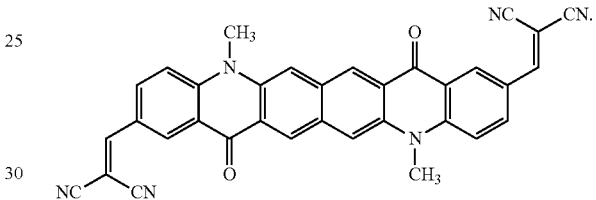

In the above Chemical Formulae 1a to 1o, $R^1$ and $R^2$ are the same as described above.

The thiophene derivative may be represented by, for example, the following Chemical Formula 2.

Chemical Formula 2
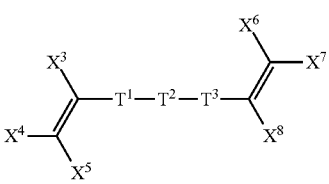

In the above Chemical Formula 2, $T^1$, $T^2$, and $T^3$ are independently an aromatic ring having a substituted or unsubstituted thiophene moiety, and $X^3$ to $X^8$ are independently hydrogen, a substituted or unsubstituted C1 to C30 alkyl group, a substituted or unsubstituted C6 to C30 aryl group, a substituted or unsubstituted C3 or C30 heteroaryl group, a cyano group, or a combination thereof. At least one of $X^3$ to $X^8$ may be a cyano group.

The $T^1$, $T^2$, and $T^3$ may be independently selected from groups listed in the following Group 1.

Group 1
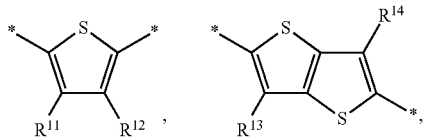

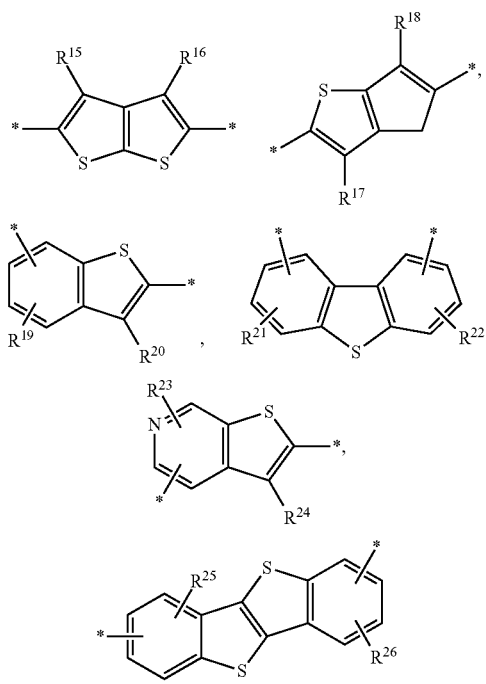

In the Group 1,

R[11] to R[26] are independently hydrogen, a substituted or unsubstituted C1 to C30 alkyl group, a substituted or unsubstituted C6 to C30 aryl group, a substituted or unsubstituted C3 to C30 heteroaryl group, or a combination thereof.

The thiophene derivative may be, for example, selected from a compound represented by the following Chemical Formulae 2a to 2j, but is not limited thereto.

Chemical Formula 2a

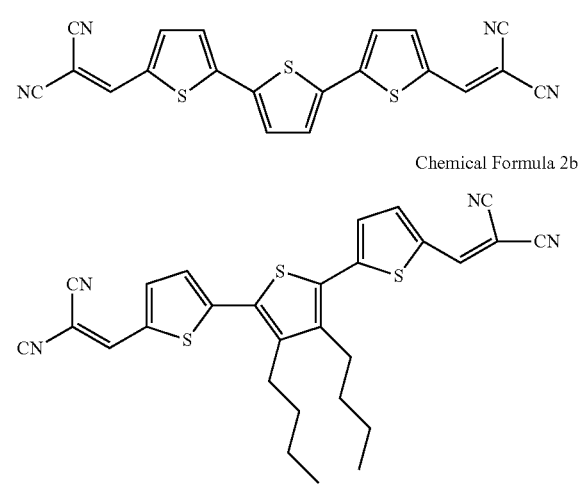

Chemical Formula 2b

Chemical Formula 2c

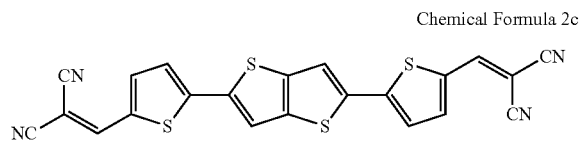

Chemical Formula 2d

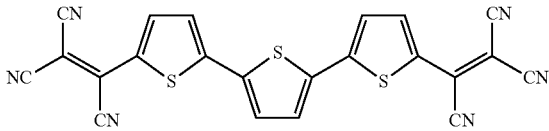

Chemical Formula 2e

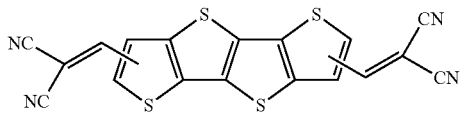

Chemical Formula 2f

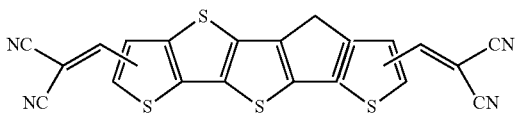

Chemical Formula 2g

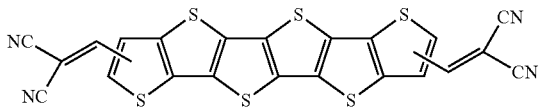

Chemical Formula 2h

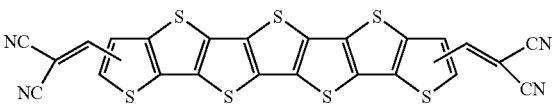

Chemical Formula 2i

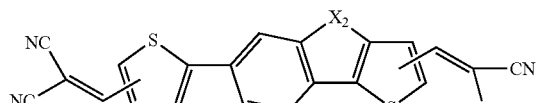

Chemical Formula 2j

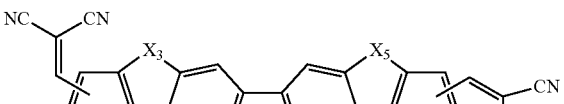

In the above Chemical Formulae 2h to 2j, $X_1$ to $X_5$ are the same or different and are independently $CR^1R^2$, $SiR^3R^4$, $NR^5$, oxygen (O), or selenium (Se), wherein $R^1$ to $R^5$ are the same or different and are independently hydrogen, a substituted or unsubstituted C1 to C20 alkyl group, a substituted or unsubstituted C6 to C20 aryl group, a substituted or unsubstituted C3 to C20 heteroaryl group, or a combination thereof.

The p-type semiconductor material may be, for example, a compound represented by the following Chemical Formula 3, and the n-type semiconductor material may be, for example, a compound represented by the following Chemical Formula 4, but they are not limited thereto.

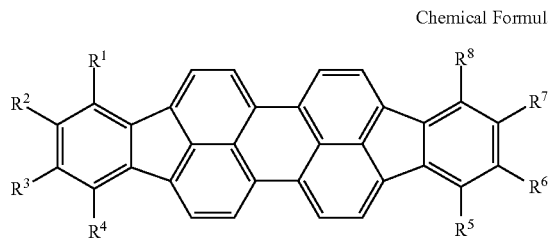

Chemical Formula 3

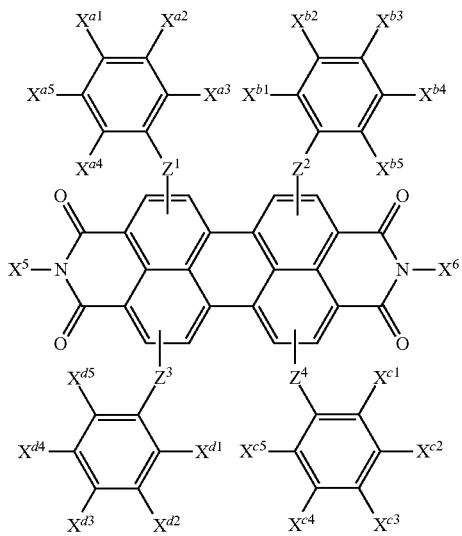

Chemical Formula 4

In the above Chemical Formula 3, $R^1$ to $R^8$ are independently hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C30 alkoxy group, a halogen atom, a halogen-containing group, or a combination thereof, wherein two adjacent groups of $R^1$ to $R^8$ may be bonded together to form a ring or a fused ring, and at least of $R^1$ to $R^8$ is a substituted or unsubstituted C6 to C30 aryl group, a substituted or unsubstituted C3 to C30 heteroaryl group, or a combination thereof.

In the above Chemical Formula 4, $Z^1$ to $Z^4$ are independently oxygen (O), nitrogen (N), or sulfur (S), $X^{a1}$ to $X^{a5}$, $X^{b1}$ to $X^{b5}$, $X^{c1}$ to $X^{c5}$, and $X^{d1}$ to $X^{d5}$ are independently hydrogen, a substituted or unsubstituted C1 to C30 alkyl group, a substituted or unsubstituted C6 to C30 aryl group, a halogen atom, a halogen-containing group, or a combination thereof, and $X^5$ and $X^6$ are independently hydrogen, a substituted or unsubstituted C1 to C30 alkyl group, a substituted or unsubstituted C6 to C30 aryl group, a substituted or unsubstituted C3 to C30 heteroaryl group, or a combination thereof.

The compound represented by the above Chemical Formula 3 may be, for example, a compound represented by one of the following Chemical Formulae 3a to 3d, and the compound represented by the above Chemical Formula 4 may be, for example, a compound represented by the following Chemical Formula 4a or 4b, but they are not limited thereto.

Chemical Formula 3a

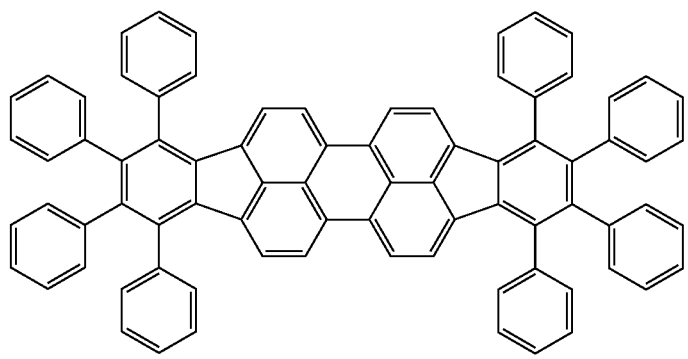

-continued
Chemical Formula 3b
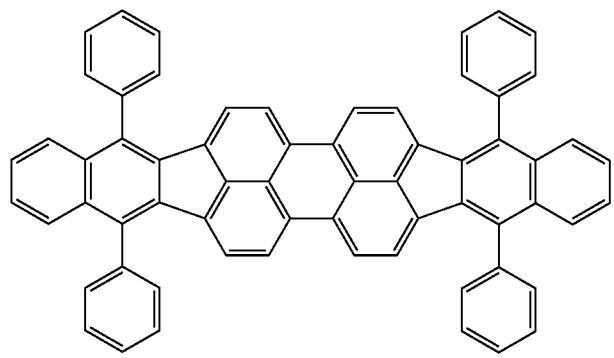
Chemical Formula 3c
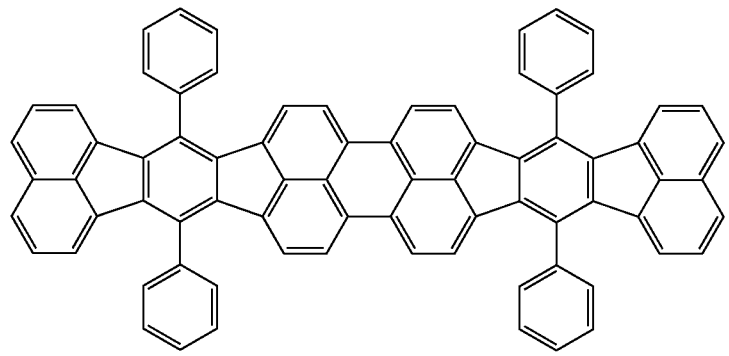
Chemical Formula 3d
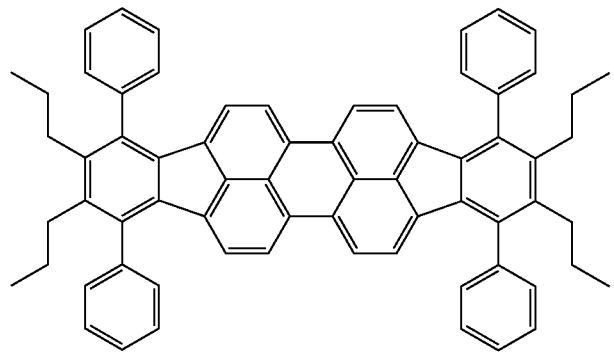
Chemical Formula 4a
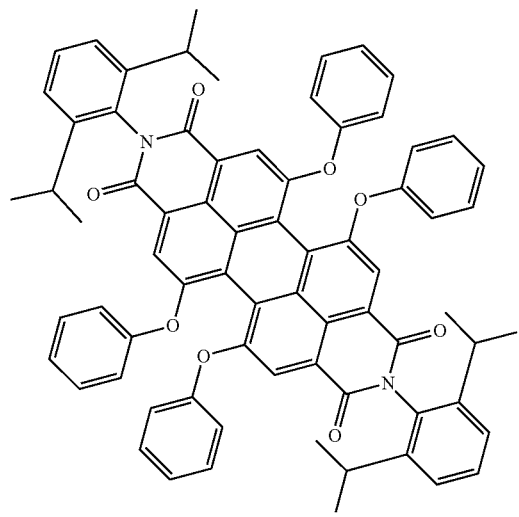

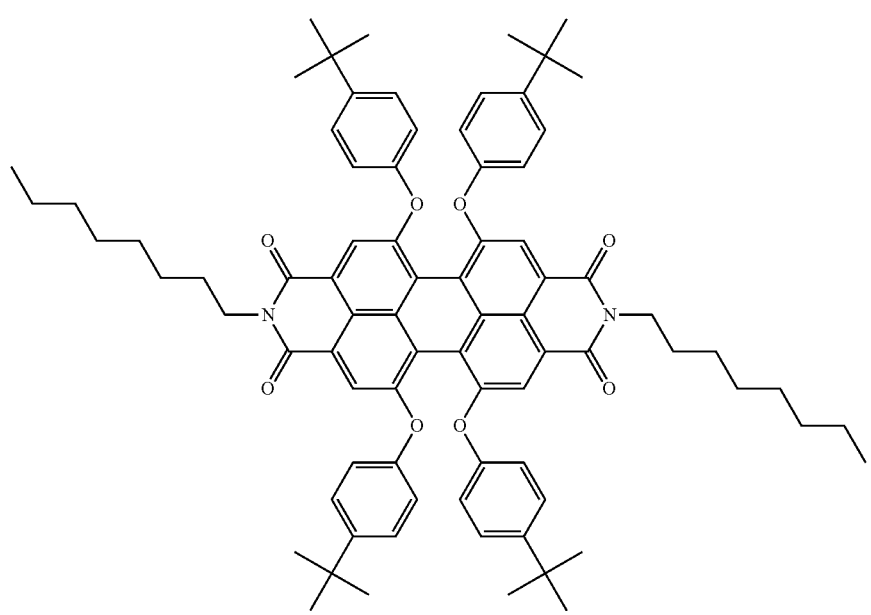

The p-type semiconductor material may be, for example, the above quinacridone or derivatives thereof, and the n-type semiconductor material may be, for example, a compound represented by the following Chemical Formula 5, but they are not limited thereto.

Chemical Formula 5

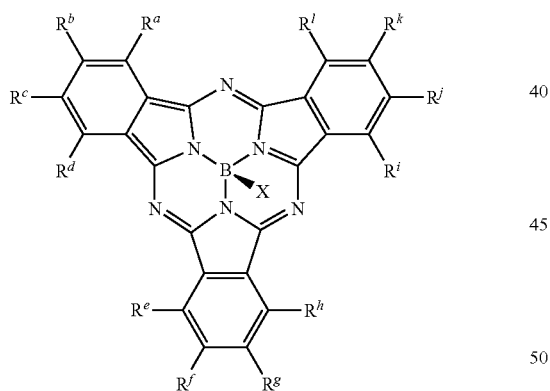

In the above Chemical Formula 5, $R^a$ to $R^l$ are independently hydrogen, a substituted or unsubstituted C1 to C30 alkyl group, a substituted or unsubstituted C6 to C30 aryl group, a substituted or unsubstituted C3 to C30 heteroaryl group, a halogen atom, a halogen-containing group, or a combination thereof, and X is a halogen atom or a C6 to C20 aryloxy group including at least one halogen atom.

The compound represented by the above Chemical Formula 5 may be, for example at least one of compounds represented by the following Chemical Formulae 5a to 5g, but is not limited thereto.

Chemical Formula 4b

Chemical Formula 5a

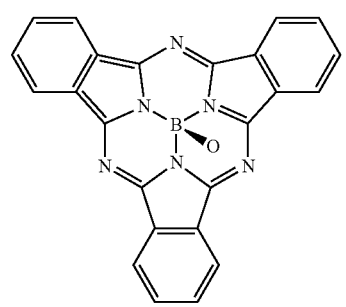

Chemical Formula 5b

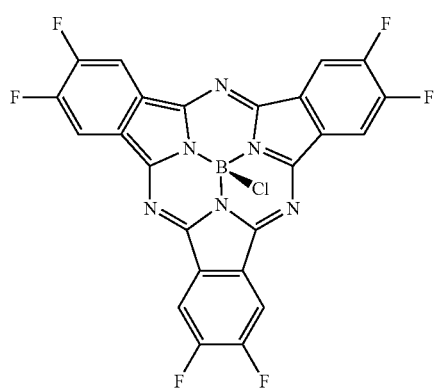

Chemical Formula 5c

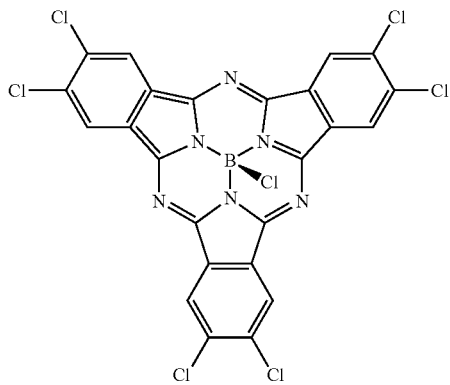

Chemical Formula 5d

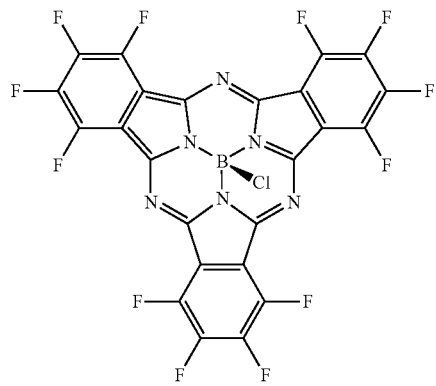

Chemical Formula 5e

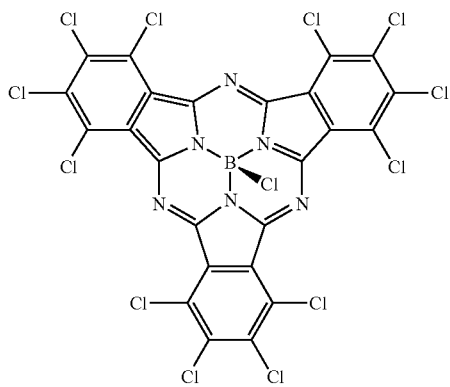

Chemical Formula 5f

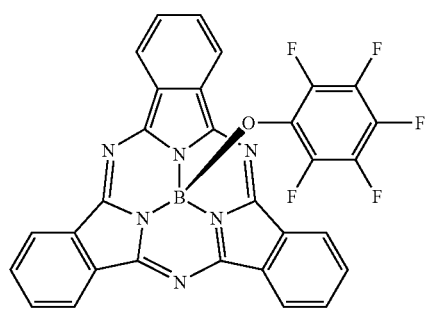

Chemical Formula 5g

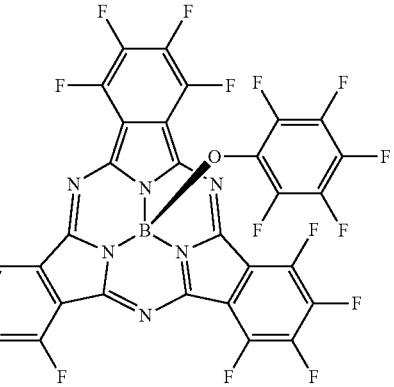

The photoactive layer 30G may be a single layer or a multilayer. The photoactive layer 30G may be, for example, an intrinsic layer (I layer), a p-type layer/I layer, an I layer/n-type layer, a p-type layer/I layer/n-type layer, a p-type layer/n-type layer, and the like.

The intrinsic layer (I layer) may include the p-type semiconductor material and the n-type semiconductor material in a thickness ratio of about 1:100 to about 100:1. The p-type semiconductor material and the n-type semiconductor material may be included in a thickness ratio ranging from about 1:50 to about 50:1 within the range, and specifically, about 1:10 to about 10:1, and more specifically, about 1:1. When the p-type and n-type semiconductor materials have a composition ratio within the range, an exciton may be effectively produced, and a pn junction may be effectively formed.

The p-type layer may include the p-type semiconductor material, and the n-type layer may include the n-type semiconductor material.

The photoactive layer 30G may have a thickness of about 1 nm to about 500 nm. Within the range, the photoactive layer 30G may have a thickness of about 5 nm to about 300 nm. When the photoactive layer 130G has a thickness within the range, the active layer may effectively absorb light, effectively separate holes from electrons, and transport them, effectively improving photoelectric conversion efficiency.

The green photo-sensing device 100G may produce excitons at the inside when light enters from the upper electrode 20G, and the photoactive layer 30G absorbs light in the green wavelength region. Excitons are separated into holes and electrons in the photoactive layer 30G, and the separated holes are moved to the anode side, which is one of the lower electrode 10G and the upper electrode 20G, and the separated electrons are moved to a cathode which is the other of the lower electrode 10G and the upper electrode 20G, so as to flow a current. The separated electrons or holes may be collected in the charge storage 55G. Light in other wavelength regions except the green wavelength region may pass through the green photo-sensing device 100G and the color filters 70B and 70R, and may be sensed by the blue photo-sensing device 50B or the red photo-sensing device 50R.

The photoactive layer 30G may be formed on the front surface of the blue pixel (B), the red pixel (R), and the green pixel (G), such that the light absorption area is increased to accomplish the high light-absorptive efficiency.

On the other hand, a white photo-sensing device 100W is formed on the semiconductor substrate 110. The white photo-sensing device 100W is disposed in the white pixel (W), and includes the light-transmitting electrodes 10W and 20W and the photoactive layer 30W as described above.

One of the light-transmitting electrodes 10W and 20W may be an anode and the other may be a cathode. The light-transmitting electrodes 10W and 20W may be made of, for example, a transparent conductor such as indium tin oxide (ITO), indium zinc oxide (IZO), zinc oxide (ZnO), tin oxide (SnO), aluminum tin oxide (AlTO), and fluorine-doped tin oxide (FTO), or may be a metal thin layer having a thin thickness of several nanometers or several tens of nanometers or a metal thin layer having a thin thickness of several nanometers to several tens of nanometers doped with a metal oxide.

The photoactive layer 30W is disposed between the light-transmitting electrodes 10W and 20W, and may absorb light in the full visible to near infrared ray region of about 380 nm to about 1300 nm. The photoactive layer 30W may include a p-type semiconductor material and an n-type semiconductor material, and for example, at least one of the p-type semiconductor material and the n-type semiconductor material may absorb light in the full visible to near infrared ray region.

The photoactive layer 30W may include, for example at least two selected from polyaniline; polypyrrole; polythiophene; poly(p-phenylenevinylene); benzodithiophene; thienothiophene; MEH-PPV (poly[2-methoxy-5-(2'-ethyl-hexyloxy)-1,4-phenylene vinylene]); MDMO-PPV (poly(2-methoxy-5-(3,7-dimethyloctyloxy)-1,4-phenylene-vinylene)); pentacene; perylene; poly(3,4-ethylenedioxythiophene) (PEDOT); poly(3-alkylthiophene); poly((4,8-bis(octyloxy)benzo[1,2-b:4,5-b'] dithiophene)-2,6-diyl-alt-(2-((dodecyloxy)carbonyl)thieno [3,4-b]thiophene)-3,6-diyl) (PTB1); poly((4,8-bis-(2-ethylhexyloxyl)benzo[1,2-b:4,5-b']dithiophene)-2,6-diyl-alt-(2-((2-ethyl hexyloxy)carbonyl)-3-fluorothieno[3,4-b] thiophene)-3,6-diyl) (PTB7); phthalocyanine; tin(II) phthalocyanine (SnPc); copper phthalocyanine; triarylamine; benzidine; pyrazoline; styrylamine; hydrazone; carbazole; thiophene; 3,4-ethylenedioxythiophene (EDOT); pyrrole; phenanthrene; tetracene; naphthalene; rubrene; 1,4,5, 8-naphthalene-tetracarboxylic dianhydride (NTCDA); Alq3; fullerene (C60, C70, C74, C76, C78, C82, C84, C720, C860, and the like); 1-(3-methoxy-carbonyl)propyl-1-phenyl(6,6) C61 (PCBM); a fullerene derivative such as C71-PCBM, C84-PCBM, bis-PCBM, and the like; an inorganic semiconductor such as CdS, CdTe, CdSe, ZnO, and the like; a derivative thereof and a copolymer thereof, but is not limited thereto.

The white photo-sensing device 100W is electrically connected to the white charge storage 55W integrated with the semiconductor substrate 110, and the charges produced from the white photo-sensing device 100W may be collected in the white charge storage 55W.

A focusing lens (not shown) may be further formed on the green photo-sensing device 100G and the white photo-sensing device 100W. The focusing lens may control the direction of incident light and gather the light in one region. The focusing lens may have a shape of, for example, a cylinder or a hemisphere, but is not limited thereto.

In the present example embodiments, for better understanding and ease of description, the structure in which the green photo-sensing device 100G is stacked is exemplified, but it is not limited thereto. The structure may be stacked with the red photo-sensing device 100R or the blue photo-sensing device 100B instead of the green photo-sensing device 100G.

As described above, by vertically stacking the color filter layers including color filters absorbing light in the blue wavelength region and light in the red wavelength region among the full visible to near infrared ray regions and the green photo-sensing device absorbing light in the green wavelength region, the area of the image sensor may be decreased, thereby down-sizing of the image sensor may be accomplished. In addition, the photo-sensing device selectively absorbing light in the green wavelength region is formed on the entire surface of the image sensor to increase the light-absorbing area and to ensure the area of the color filter layer, so the light-absorptive efficiency may be enhanced.

Furthermore, by further including the white pixel W as described above, the light-absorptivity of incident light is increased to reduce the light loss, and simultaneously the spectral sensitivity of the full visible to near infrared ray region is increased to improve the total sensitivity of the image sensor.

Hereinafter, the image sensor according to further example embodiments is described with reference to FIG. 8 and FIG. 9.

Figure 8:
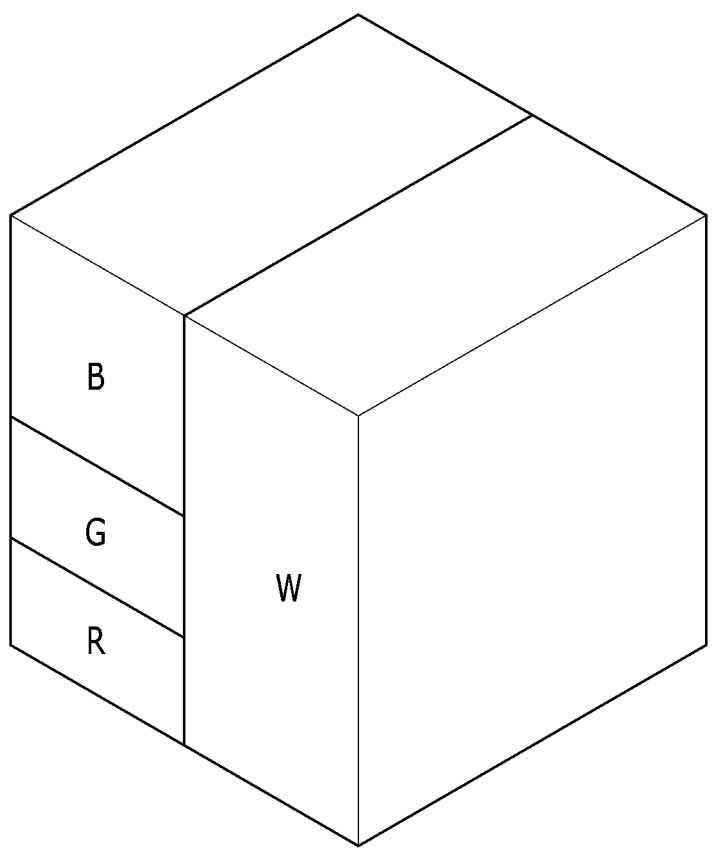
Figure 9:
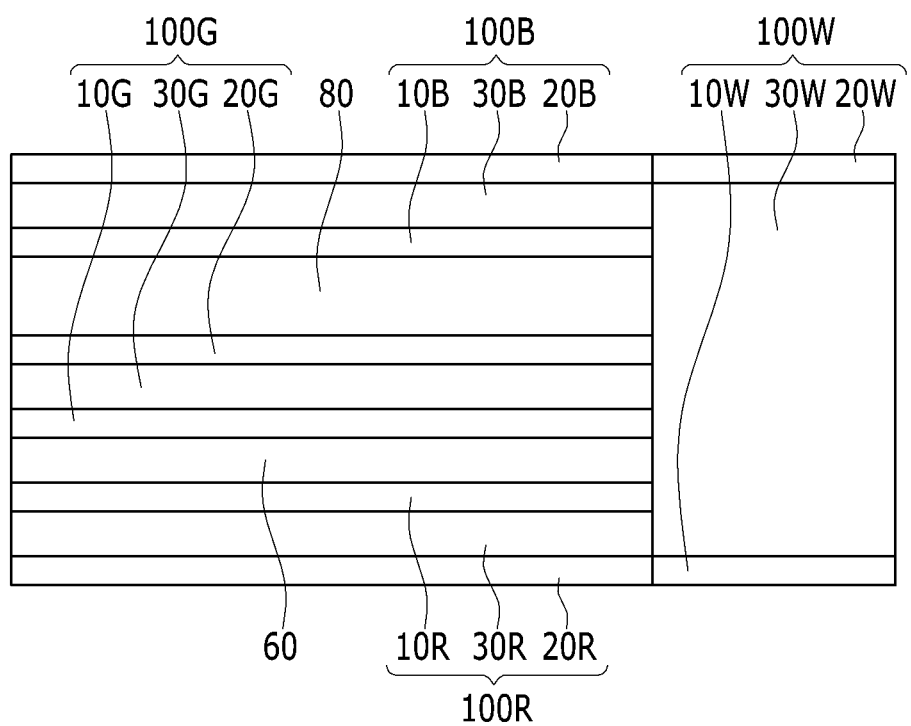

FIG. 8 is a schematic view showing a pixel arrangement in the image sensor according to further example embodiments, and FIG. 9 is a cross-sectional view showing one example of image sensor shown in FIG. 8.

Referring to FIG. 8, in the image sensor according to example embodiments, the blue pixel B, the green pixel G, and the red pixel R are vertically stacked, and the white pixel W is arranged adjacent and parallel to the blue pixel B, the red pixel R, and the green pixel G.

In the present example embodiment, the white photo-sensing device, the blue photo-sensing device, the green photo-sensing device, and the red photo-sensing device may independently be an organic photodiode.

Referring to FIG. 9, in the image sensor according to example embodiments, the red photo-sensing device 100R, the green photo-sensing device 100G, and the blue photo-sensing device 100B are sequentially stacked.

The red photo-sensing device 100R includes a lower electrode 10R, an upper electrode 20R, and a photoactive layer 30R selectively absorbing light in a red wavelength region; the green photo-sensing device 100G includes a lower electrode 10G, an upper electrode 20G, and a photoactive layer 30G selectively absorbing light in a green wavelength region; and the blue photo-sensing device 100B includes a lower electrode 10B, an upper electrode 20B, and a photoactive layer 30B selectively absorbing light in a blue wavelength region.

The lower electrodes 10B, 10G, and 10R and the upper electrodes 20B, 20G, and 20R may be light-transmitting electrodes, and may be made of, for example, a transparent conductor such as indium tin oxide (ITO), indium zinc oxide (IZO), zinc oxide (ZnO), tin oxide (SnO), aluminum tin oxide (AlTO), and fluorine-doped tin oxide (FTO), or may be a metal thin layer having a thin thickness of several nanometers or several tens of nanometers or a metal thin layer having a thin thickness of several nanometers to several tens of nanometers doped with a metal oxide.

The photoactive layers 30B, 30G, and 30R may include a p-type semiconductor material and an n-type semiconductor material. The photoactive layer 30B of the blue photo-sensing device 100B may include a p-type semiconductor material selectively absorbing light in a blue wavelength region and an n-type semiconductor material selectively absorbing light in a blue wavelength region; the photoactive layer 30G of the green photo-sensing device 100G may include a p-type semiconductor material selectively absorbing light in a green wavelength region and an n-type semiconductor material selectively absorbing light in a green wavelength region; and the photoactive layer 30R of the red photo-sensing device 100R may include a p-type semiconductor material selectively absorbing light in a red wavelength region and an n-type semiconductor material selectively absorbing light in a red wavelength region.

In the present example embodiments, for better understanding and ease of description, the structure in which the red photo-sensing device 100R, the green photo-sensing device 100G, and the blue photo-sensing device 100B are stacked is exemplified, but it is not limited thereto, and the stacking order may be variously changed.

The white photo-sensing device 100W is arranged adjacent to the red photo-sensing device 100R, the green photo-sensing device 100G, and the blue photo-sensing device 100B.

The white photo-sensing device 100W includes light-transmitting electrodes 10W and 20W and a photoactive layer 30W.

One of the light-transmitting electrodes 10W and 20W may be an anode and the other may be a cathode. The light-transmitting electrodes 10W and 20W may be made of, for example, a transparent conductor such as indium tin oxide (ITO), indium zinc oxide (IZO), zinc oxide (ZnO), tin oxide (SnO), aluminum tin oxide (AlTO), and fluorine-doped tin oxide (FTO), or may be a metal thin layer having a thin thickness of several nanometers or several tens of nanometers or a metal thin layer having a thin thickness of several nanometers to several tens of nanometers doped with a metal oxide.

The photoactive layer 30W is disposed between light-transmitting electrodes 10W and 20W, and may absorb light in the full visible to near infrared ray region of about 380 nm to about 1300 nm. The photoactive layer 30W may include a p-type semiconductor material and an n-type semiconductor material. For example, at least one of the p-type semiconductor material and the n-type semiconductor material may absorb light in the full visible to near infrared ray region.

The photoactive layer 30W may include, for example, at least two selected from polyaniline; polypyrrole; polythiophene; poly(p-phenylenevinylene); benzodithiophene; thienothiophene; MEH-PPV (poly[2-methoxy-5-(2'-ethylhexyloxy)-1,4-phenylene vinylene]); MDMO-PPV (poly(2-methoxy-5-(3,7-dimethyloctyloxy)-1,4-phenylene-vinylene)); pentacene; perylene; poly(3,4-ethylenedioxythiophene) (PEDOT); poly(3-alkylthiophene); poly((4,8-bis(octyloxy)benzo[1,2-b:4,5-b'] dithiophene)-2,6-diyl-alt-(2-((dodecyloxy)carbonyl)thieno [3,4-b]thiophene)-3,6-diyl) (PTB1); poly((4,8-bis(2-ethylhexyloxy)benzo[1,2-b:4,5-b']dithiophene)-2,6-diyl-alt-(2-((2-ethyl hexyloxy)carbonyl)-3-fluorothieno[3,4-b] thiophene)-3,6-diyl) (PTB7); phthalocyanine; tin(II) phthalocyanine (SnPc); copper phthalocyanine; triarylamine; benzidine; pyrazoline; styrylamine; hydrazone; carbazole; thiophene; 3,4-ethylenedioxythiophene (EDOT); pyrrole; phenanthrene; tetracene; naphthalene; rubrene; 1,4,5, 8-naphthalene-tetracarboxylic dianhydride (NTCDA); Alq3; fullerene (C60, C70, C74, C76, C78, C82, C84, C720, C860, and the like); 1-(3-methoxy-carbonyl)propyl-1-phenyl(6,6) C61 (PCBM); a fullerene derivative such as C71-PCBM, C84-PCBM, bis-PCBM, and the like; an inorganic semiconductor such as CdS, CdTe, CdSe, ZnO, and the like; a derivative thereof and a copolymer thereof, but is not limited thereto.

Figure 10:
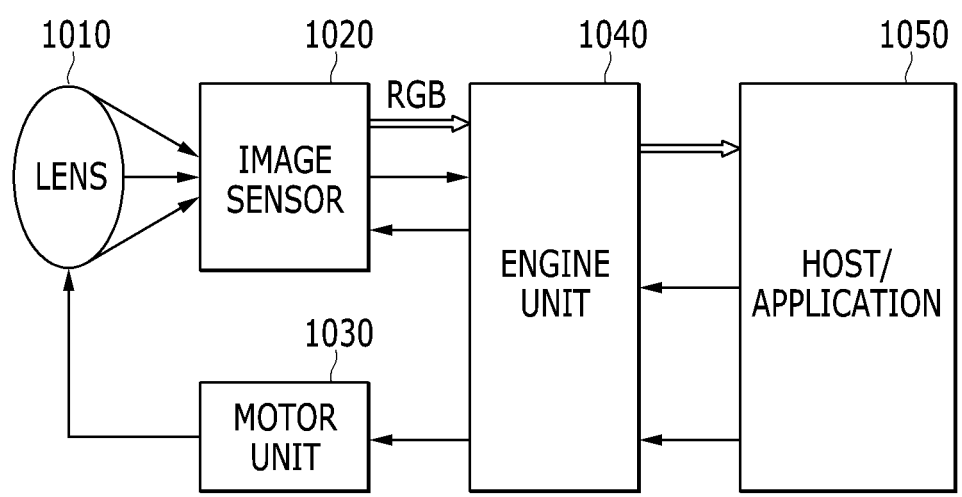

FIG. 10 is a block diagram of a digital camera using an image sensor according to example embodiments.

Referring to FIG. 10, the digital camera 1000 may include a lens 1010, an image sensor 1020, a motor unit 1030, and an engine unit 1040. The image sensor 1020 may be any one of the image sensors according to the above-described example embodiments in FIGS. 1-9.

The lens 1010 focuses incident light onto the image sensor 1020. The image sensor 1020 may generate RGB data based on the light received through the lens 1010.

In some example embodiments, the image sensor 1020 may interface with the engine unit 1040.

The motor unit 1030 may adjust the focus of the lens 1010 or perform shuttering in response to a control signal received from the engine unit 1040. The engine unit 1040 may control the image sensor 1020 and the motor unit 1030.

The engine unit 1040 may be connected to a host/application 1050.

The image sensors according to example embodiments may reduce the light loss by increasing the photo-absorptivity and may simultaneously improve the total sensitivity of the image sensor by increasing the spectral sensitivity of the full visible to near infrared ray region. In addition, the area of the image sensor may be decreased according to the pixel arrangement, so the down-sizing of the image sensor may be accomplished, and the light-absorptive efficiency may be enhanced.

The image sensor may be applied to, for example, various electronic devices such as a mobile phone or a digital camera, but is not limited thereto.

While this disclosure has been described in connection with what is presently considered to be practical exemplary embodiments, it is to be understood that the disclosure is not limited to the disclosed example embodiments, but, on the contrary, is intended to cover various modifications and equivalent arrangements included within the spirit and scope of the appended claims.

What is claimed is:

1. An image sensor, comprising:
   a first photo-sensing device configured to sense light in a full visible light region;
   a second photo-sensing device configured to sense light in a blue wavelength region;
   a third photo-sensing device configured to sense light in a red wavelength region; and
   a fourth photo-sensing device configured to sense light in a green wavelength region, wherein
   at least one of the first photo-sensing device, the second photo-sensing device, the third photo-sensing device, and the fourth photo-sensing device includes,
   a pair of light-transmitting electrodes facing each other, and
   a photoactive layer between the pair of light-transmitting electrodes, the photoactive layer including an organic light-absorbing material.

2. The image sensor of claim 1, wherein the first, second, third, and fourth photo-sensing devices are arranged adjacent and parallel, or perpendicular, to each other collectively in the form of a single group.

3. The image sensor of claim 1, wherein the first photo-sensing device includes,
   a first pair of light-transmitting electrodes, and
   a first photoactive layer between the first pair of light-transmitting electrodes and including a first organic light-absorbing material configured to absorb light in the full visible light region.

4. The image sensor of claim 3, wherein the first organic light-absorbing material includes a p-type semiconductor material and an n-type semiconductor material, wherein,
at least one of the p-type semiconductor material and the n-type semiconductor material is configured to absorb light in the full visible light region.

5. The image sensor of claim 3, wherein
the second photo-sensing device includes a second pair of light-transmitting electrodes and a second photoactive layer between the second pair of light-transmitting electrodes, the second photoactive layer includes a second organic light-absorbing material configured to selectively absorb light in the blue wavelength region,
the third photo-sensing device includes a third pair of light-transmitting electrodes and a third photoactive layer between the third pair of light-transmitting electrodes, the third photoactive layer including a third organic light-absorbing material configured to selectively absorb light in the red wavelength region, and
the fourth photo-sensing device includes a fourth pair of light-transmitting electrodes and a fourth photoactive layer between the fourth pair of light-transmitting electrodes, the fourth photoactive layer includes a fourth organic light-absorbing material configured to selectively absorb light in the green wavelength region.

6. The image sensor of claim 3, further comprising:
a semiconductor substrate integrated with the second photo-sensing device, the third photo-sensing device, and the fourth photo-sensing device; and
a color filter layer on the semiconductor substrate, the color filter including a blue filter configured to selectively absorb light in the blue wavelength region, a red filter configured to selectively absorb light in the red wavelength region, and a green filter configured to selectively absorb light in the green wavelength region.

7. The image sensor of claim 3, further comprising:
a color filter layer on the first photo-sensing device, wherein,
the color filter layer includes a blue filter configured to selectively absorb light in the blue wavelength region, a red filter configured to selectively absorb light in the red wavelength region, and a green filter configured to selectively absorb light in the green wavelength region.

8. The image sensor of claim 1, further comprising:
a semiconductor substrate integrated with the first photo-sensing device, wherein,
at least one of the second, third and fourth photo-sensing devices includes the pair of light-transmitting electrodes and the photoactive layer.

9. The image sensor of claim 1, further comprising:
a semiconductor substrate integrated with the second photo-sensing device and the third photo-sensing device; and
a color filter layer on the semiconductor substrate, the color filter including a blue filter configured to selectively absorb light in the blue wavelength region and a red filter configured to selectively absorb light in the red wavelength region, wherein,
the fourth photo-sensing device is on the color filter layer,
the fourth photo-sensing device includes a first pair of light-transmitting electrodes facing each other and a first photoactive layer between the first pair of light-transmitting electrodes, and
the first photoactive layer is configured to selectively absorb light in the green wavelength region.

10. The image sensor of claim 9, wherein the first photoactive layer includes a p-type semiconductor material configured to selectively absorb light in the green wavelength region and an n-type semiconductor material configured to selectively absorb light in the green wavelength region.

11. The image sensor of claim 9, wherein the first photo-sensing device includes,
a second pair of light-transmitting electrodes, and
a second photoactive layer between the second pair of light-transmitting electrodes and absorbing light in the full visible light region.

12. The image sensor of claim 9, wherein the first photo-sensing device is integrated with the semiconductor substrate.

13. The image sensor of claim 1, wherein
the blue wavelength region has a maximum absorption wavelength ($\lambda_{max}$) of greater than or equal to about 400 nm and less than about 500 nm,
the red wavelength region has a maximum absorption wavelength ($\lambda$max) of greater than about 580 nm and less than or equal to about 700 nm, and
the green wavelength region has a maximum absorption wavelength ($\lambda$max) ranging from about 500 nm to about 580 nm.

14. The image sensor of claim 1, wherein the organic light-absorbing material includes a p-type semiconductor material and an n-type semiconductor material.

15. An electronic device, comprising the image sensor according to claim 1.

* * * * *